(12) United States Patent
Moore

(10) Patent No.: US 10,911,058 B2
(45) Date of Patent: Feb. 2, 2021

(54) SWITCHED CAPACITOR COMPARATOR

(71) Applicant: Analog Devices, Inc., Norwood, MA (US)

(72) Inventor: Ralph D. Moore, Greensboro, NC (US)

(73) Assignee: ANALOG DEVICES, INC., Norwood, MA (US)

(*) Notice: Subject to any disclaimer, the term of this patent is extended or adjusted under 35 U.S.C. 154(b) by 0 days.

(21) Appl. No.: 16/746,949

(22) Filed: Jan. 19, 2020

(65) Prior Publication Data

US 2020/0153445 A1 May 14, 2020

Related U.S. Application Data

(63) Continuation of application No. 16/184,184, filed on Nov. 8, 2018, now Pat. No. 10,541,698.

(51) Int. Cl.
*H03M 1/00* (2006.01)
*H03M 1/12* (2006.01)
*H03M 1/16* (2006.01)

(52) U.S. Cl.
CPC .......... *H03M 1/001* (2013.01); *H03M 1/12* (2013.01); *H03M 1/164* (2013.01)

(58) Field of Classification Search
CPC ........ H03M 1/001; H03M 1/12; H03M 1/164; H03M 1/1245; H03M 1/167

USPC ......................................... 341/155, 144, 150
See application file for complete search history.

(56) References Cited

U.S. PATENT DOCUMENTS

| | | | |
|---|---|---|---|
| 6,563,363 B1 * | 5/2003 | Tay | H03K 5/2481 327/337 |
| 7,564,273 B2 * | 7/2009 | Guyton | G06G 7/186 327/337 |
| 9,557,354 B2 * | 1/2017 | Chen | G01R 19/16552 |

* cited by examiner

*Primary Examiner* — Brian K Young
(74) *Attorney, Agent, or Firm* — Patent Capital Group

(57) ABSTRACT

Multiplying digital-to-analog converter (MDACs) are implemented in pipelined ADCs to generate an analog output being fed to a subsequent stage. A switched capacitor MDAC can be implemented by integrating a capacitor digital-to-analog converter (DAC) with charge pump gain circuitry. The capacitor DAC can implement the DAC functionality while the charge pump gain circuitry can implement subtraction and amplification. The resulting switched capacitor MDAC can leverage strengths of nanometer process technologies, i.e., very good switches and highly linear capacitors, to achieve practical pipelined ADCs. Moreover, the switched capacitor MDAC has many benefits over other approaches for implementing the MDAC.

20 Claims, 13 Drawing Sheets

DURING A SAMPLE PHASE, CONNECTING A FIRST ONE OF COMPLEMENTARY ANALOG INPUT SIGNALS TO A FIRST PLATE OF GAIN CAPACITOR, AND CONNECTING A SECOND ONE OF COMPLEMENTARY ANALOG INPUT SIGNALS TO A COMMON NODE CONNECTING FIRST PLATES OF CAPACITORS WITHIN A CAPACITIVE DIGITAL TO ANALOG CONVERTER 902

DURING A CHARGE TRANSFER PHASE, CONNECTING THE FIRST PLATE OF THE GAIN CAPACITOR TO THE COMMON NODE, CONNECTING EACH ONE OF SECOND PLATES OF THE CAPACITORS WITHIN THE CAPACITIVE DIGITAL TO ANALOG CONVERTER TO A FIRST REFERENCE OR A SECOND REFERENCE BASED ON AN OUTPUT CODE CONTROLLING THE CAPACITOR DIGITAL TO ANALOG CONVERTER, AND OUTPUTTING A RESIDUE SIGNAL AT A SECOND PLATE OF THE GAIN CAPACITOR 904

FIGURE 9

SWITCHED CAPACITOR COMPARATOR

PRIORITY DATA

This application is a Continuation Application of U.S. Non-Provisional patent application Ser. No. 16/184,184 (filed on Nov. 8, 2018, and entitled "SWITCHED CAPACITOR MULTIPLYING DIGITAL-TO-ANALOG CONVERTER"), which is hereby incorporated by reference in its entirety.

TECHNICAL FIELD OF THE DISCLOSURE

The present disclosure relates to the field of integrated circuits, in particular to multiplying digital-to-analog converters.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense. As the applications needing ADCs grow, the need for accurate and reliable conversion performance also grows.

OVERVIEW

Multiplying digital-to-analog converter (MDACs) are implemented in pipelined ADCs to generate an analog output being fed to a subsequent stage. A switched capacitor MDAC can be implemented by integrating a capacitor digital-to-analog converter (DAC) with charge pump gain circuitry. The capacitor DAC can implement the DAC functionality while the charge pump gain circuitry can implement subtraction and amplification. The resulting switched capacitor MDAC can leverage strengths of nanometer process technologies, i.e., very good switches and highly linear capacitors, to achieve practical pipelined ADCs. Moreover, the switched capacitor MDAC has many benefits over other approaches for implementing the MDAC.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 9 is a flow diagram illustrating a method for residue generation, according to some embodiments of the disclosure;

DESCRIPTION OF EXAMPLE EMBODIMENTS OF THE DISCLOSURE

Overview

Multiplying digital-to-analog converter circuits in pipelined analog-to-digital converters can be a challenge to design and implement. A multiplying digital-to-analog converter circuit involves digital-to-analog conversion, subtraction, and gain. Linearity, circuit complexity, and power consumption are dominant design considerations for a multiplying digital-to-analog converter. By using charge redistribution and open loop charge pump gain, a switched capacitor multiplying digital-to-analog converter can achieve good linearity without being constrained to a 1 bit effective stage.

Understanding Pipelined ADCs

One exemplary type of ADCs is the pipelined ADC, which is typically categorized as a high speed ADC (e.g., with sample rates above 5 million samples per second (MSPS) or even above 10 MSPS). Pipelined ADCs are used often with video, sampling radio applications, instrumentation (digital oscilloscopes, digital spectrum analyzers), etc. A pipelined ADC comprises a plurality of stages, where the stages are cascaded. Different designs may vary design parameters such as the number of stages, the number of bits per stage, and timing. A first stage digitizes an analog input to the pipelined ADC, and a following stage digitizes an amplified residue from the first stage. The amplified residue is an amplified version of a difference between the analog input and a reconstructed analog input which was generated based on a digital output of the first stage. The pipelined ADC can include further stages for digitizing further residues. Digital outputs from the cascaded stages are combined to generate a final digital output, which has a number of bits representing the original analog input of the pipelined ADC. The term "pipelined" refers to the ability of one stage to process data from the previous stage during any given clock cycle. At the end of each phase of a particular clock cycle, the output of a given stage is passed on to the next stage and new data is shifted into the stage.

The MDAC in a Stage of the Pipelined ADC

Figure 1:
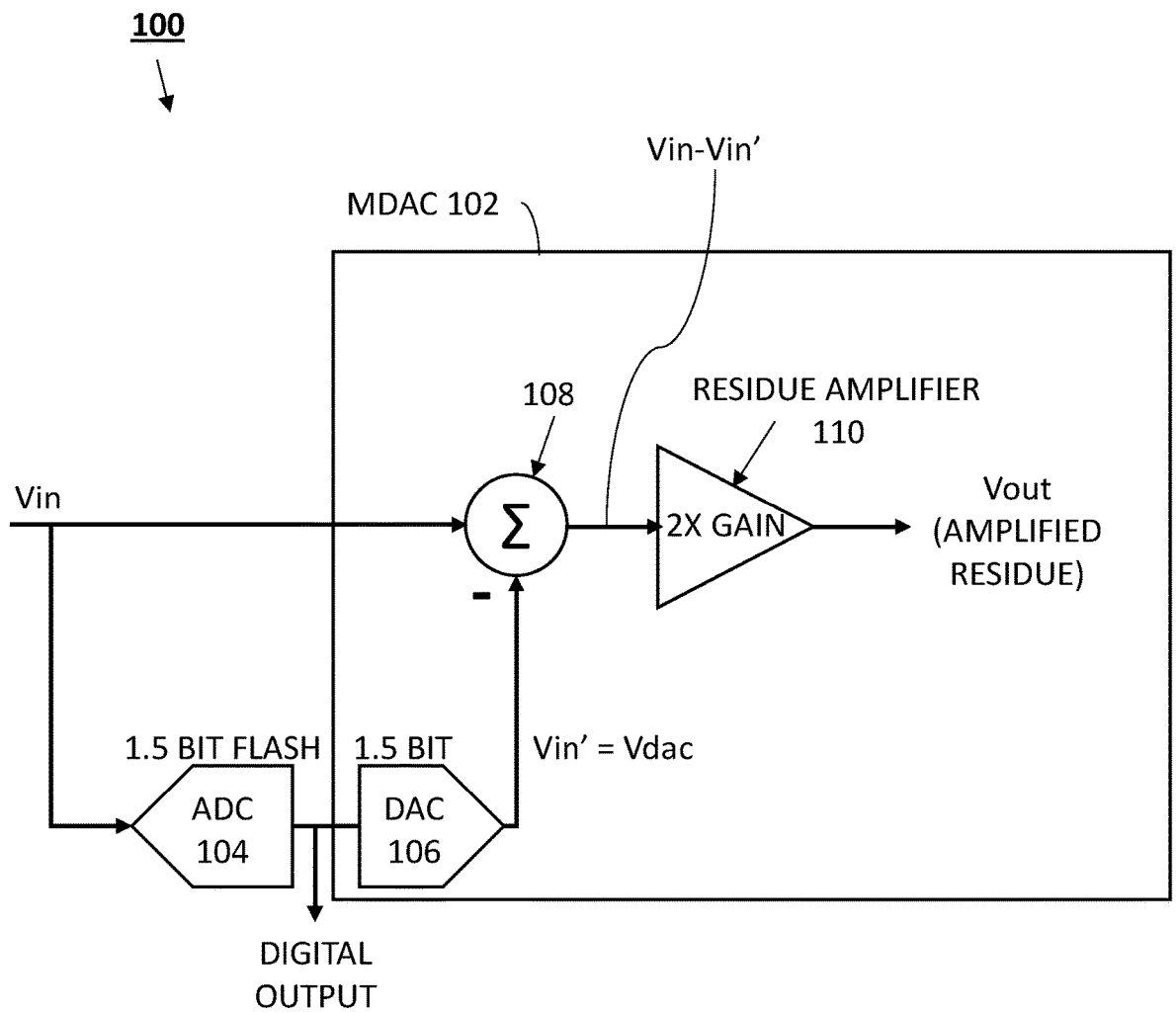
FIG. 1 shows an exemplary stage of a pipelined ADC, according to some embodiments of the disclosure.

FIG. 1 shows an exemplary stage of a pipelined ADC, according to some embodiments of the disclosure. In stage 100, the analog input Vin is digitized by ADC 104, which can be a coarse ADC for coarsely digitizing the analog input Vin. In one example, the ADC 104 is a 1.5 bit ADC, which can generate three possible digital outputs or levels. ADC 104 can be implemented as a flash ADC, which generates the digital output based on a bank of comparators and successive reference voltages. For a 1.5 bit flash ADC, two comparators can be used to produce the three possible digital outputs or levels. Flash ADCs are often used since Flash ADCs can often generate the digital output at relatively high speeds.

The digital output of the stage is then fed to a DAC 106 to generate the reconstructed analog input Vin'. The DAC 106 can have a resolution (e.g., 1.5 bit) which corresponds to the resolution of ADC 104. A summation node or subtraction node 108 can be used to determine the difference between the analog input Vin and the reconstructed analog input Vin' (i.e., Vin−Vin'). The difference is then amplified by residue amplifier 110, which may provide a two times (2×) gain, to generate the amplified residue Vout. The amplified residue Vout is provided to a following stage for further digitization. In other words, the following stage receives the amplified residue Vout as the analog input and generates a further digital output signal. If more stages are provided the following stage can generate a further amplified residue for the subsequent stage(s).

For a stage in a pipelined ADC, a multiplying DAC (MDAC) 102 provides the digital-to-analog conversion function, an appropriate amount of (interstage) gain/amplification, as well as the subtraction function. The circuit architecture can often vary for each one of these functions. The MDAC circuit design is not trivial and can depend on different constraints of the pipelined ADC. For instance, accuracies of the digital-to-analog conversion function and the gain/amplification function can significantly impact the overall accuracy of the pipelined ADC. Factors relating to accuracies can include noise and linearity. Circuit complexity, power consumption, and area, can also affect the circuit designs.

MDACs are used in many different kinds of circuits. As discussed in relation to FIG. 1, MDACs can be implemented in a stage of a pipelined ADC where residue signals are generated and processed by subsequent stages. Besides pipelined ADCs, MDAC circuits can be found in other ADC architectures, such as multi-stage delta-sigma ADCs, sub-ranging ADCs, successive-approximation-register ADCs. Various embodiments herein can be applied to other circuits and ADC architectures.

Charge Pump Gain in an MDAC

The amplification function of the MDAC (referring to residue amplifier 110 of FIG. 1) may be implemented with charge pump (CP) gain rather than the traditional charge amplifier. In contrast to the traditional charge amplifier, CP gain has no feedback involved (akin to an open loop design). As a result, MDAC implemented with CP gain can provide a greatly simplified architecture with significantly lower noise. Gain is not precisely controlled by a ratio of input and feedback capacitors (as in the traditional charge amplifier), rather it is dominantly set by the ratio of input capacitance to various parasitic capacitances. Digital post processing can used to compensate for actual gain relative to ideal stage gain.

An exemplary CP gain circuit, implemented based on switches and capacitors, can achieve gain by sampling an input voltage onto multiple capacitors, and putting the capacitors in series (e.g., stacking the capacitors) to add up the voltages sampled on the multiple capacitors. Adding the voltages effectively implements amplification. By applying an appropriate voltage based on the DAC output to the capacitors when the capacitors are stacked, subtraction function (referring to subtraction node 108) can also be achieved. Appropriate topology and timing for the switches enables sampling, gain, and subtraction to be implemented with switched capacitor circuitry. In other words, a suitable CP gain circuit can implement subtraction node 108 and residue amplifier 110 of MDAC 102 of FIG. 1.

Figure 2:
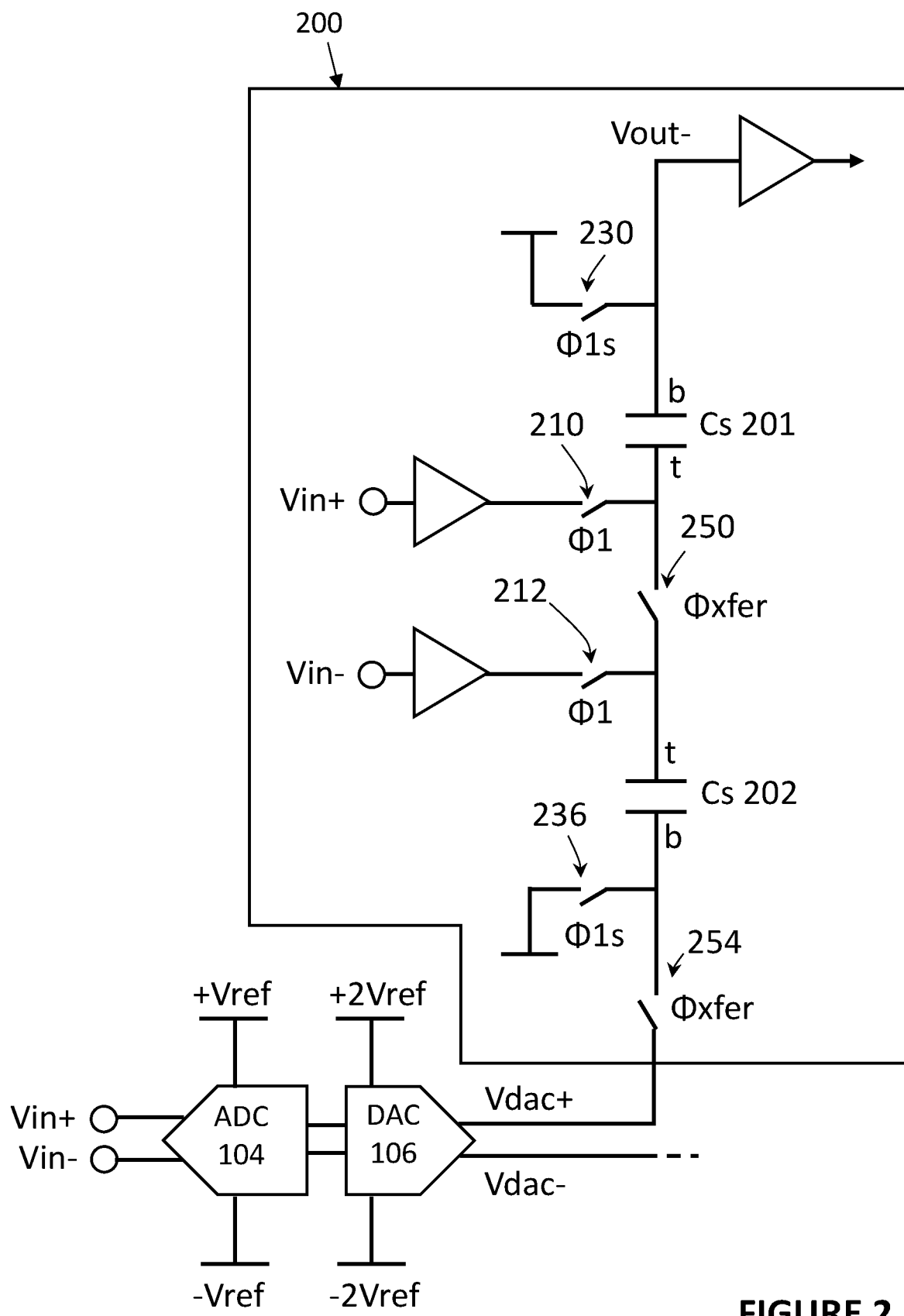
FIG. 2 illustrates an exemplary charge pump gain circuit in a multiplying digital-to-analog converter in a stage of a pipelined ADC.

FIG. 2 illustrates an exemplary CP gain circuit 200 in an MDAC of a pipelined ADC. The CP gain circuit 200 implements charge pump gain with switches and capacitors in a unique topology. The capacitors are provided to trap or capture charge, and switches facilitate sampling, tracking and/or transferring of charge in the CP gain circuit 200. The disclosed architecture is extendable to greater than having two times (2×) gain. For simplicity, a 2× gain configuration is demonstrated.

For purposes of discussion, switches are used to describe devices that can be in an "open" state, or in a "closed" state. The devices can be implemented using transistors, where an "open" state of a switch corresponds to an "off" transistor and a "closed" state of a switch corresponds to an "on" transistor. A transistor can have a control terminal for receiving a control signal that can open the switch (transistor is off or not conducting current between two signal terminals) or close the switch (transistor is on and conducting current between two signal terminals). A logical "high" for a control signal can close the switch (transistor is on). A logical "low" for a control signal can open the switch (transistor is off). Phase symbols next to the switches in various FIGURES serve to illustrate the timing of the control signals for controlling the state of the switches.

First capacitor Cs 201 is between first input switch 210 for coupling a first one of complementary analog input signals (Vin+) to the first capacitor Cs 201 and a first one of complementary output nodes of the CP gain circuit (Vout−). In other words, Vin+ is on one side/plate of first capacitor Cs 201, Vout− is on the other side/plate of first capacitor Cs 201. Second capacitor Cs 202 is between second input switch 212 for coupling a second one of the complementary analog input signals (Vin−) to the second capacitor Cs 202 and transfer switch 254 for coupling the second capacitor Cs 202 to one of the complementary outputs of DAC 106 (Vdac+ in this example). In other words, Vin+ is on one side/plate of second capacitor Cs 202, Vdac+ is on the other side/plate of second capacitor Cs 202. Transfer switch 250 is between first capacitor Cs 201 and second capacitor Cs 202, and closing the transfer switch 250 can sum charges captured or sampled on the first capacitor Cs 201 and second capacitor Cs 202. When the transfer switch 250 is closed, the first capacitor Cs 201 and the second capacitor Cs 202 are stacked. The transfer switch 250 is on the same side/plate of the first capacitor Cs 201 as the first input switch 210; the transfer switch 250 is also on the same side/plate of the second capacitor Cs 202 as the second input switch 212.

The CP gain circuit 200 can optionally implement bottom plate sampling. In bottom plate sampling, an input is coupled to a top plate of a sampling capacitor via an input switch, and on the other plate of the sampling capacitor (i.e., the bottom plate of the sampling capacitor) is another switch called a bottom plate sampling switch. The bottom plate sampling switch can couple the bottom plate to a fixed voltage (e.g., Ground, or one of the voltage rails or power supplies), and the bottom plate sampling switch opens before the input switch is opened. Purpose of bottom plate sampling is to reduce input dependent charge from being injected to the sampling capacitor when the input switch opens. Top and bottom plates of first capacitor Cs 201 and second capacitor Cs 202 are labeled "t" and "b" respectively. First bottom plate sampling switch 230 implements bottom plate sampling for the first capacitor Cs 201. Second bottom plate sampling switch 236 implements bottom plate sampling for second capacitor Cs 202. In this example, the first and second bottom plate sampling switches 230 and 236 connects the bottom plate of first capacitor Cs 201 and second capacitor Cs 202 to Ground respectively.

Complementary analog input signals Vin+ and Vin− can be buffered by respective input buffers (optional). The complementary analog output signals at the complementary output nodes Vout− and Vout+ can also be buffered by respective output buffers (optional) before passing the complementary analog output signals to a subsequent circuit stage. Different kinds of circuits can be implemented at the complementary output nodes. Examples include: open loop amplifier, open loop buffer, closed loop amplifier with feedback capacitance, operational amplifier, and comparator.

For simplicity, only half of the differential CP gain circuit is shown. It is understood that a complementary circuit can be implemented to receive Vin+, Vin−, and the other complementary output of DAC 106 (Vdac−) and output a voltage at the other complementary output node of the CP gain circuit (Vout+). While a differential circuit is envisioned by the example in FIG. 2, it is understood that a single-ended version of the CP gain circuit can also be implemented.

Figure 3:
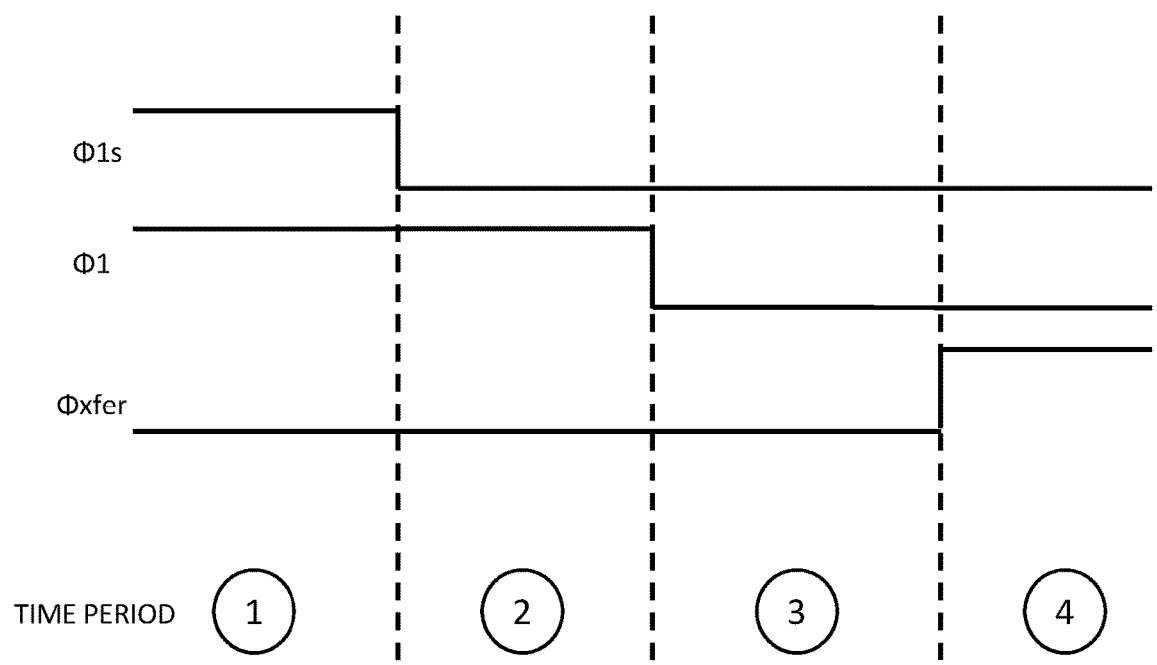
FIG. 3 shows a timing diagram illustrating the different phases of operation for the exemplary charge pump gain circuit of FIG. 2, according to some embodiments of the disclosure.

FIG. 3 shows a timing diagram illustrating the different phases of operation for the exemplary CP gain circuit 200 of FIG. 2, according to some embodiments of the disclosure. There are three control signals, ϕ1s, ϕ1, and ϕxfer. These control signals are shown next to corresponding switches. The control signals have different timings for operating the CP gain circuit 200 of FIG. 2. During time period 1, input switches and bottom plate switches are closed (as indicated by logical "high" for ϕ1s, and ϕ1). Transfer switches are open (as indicated by logical "low" for ϕxfer). To implement bottom plate sampling, during time period 2, bottom plate switches open (as indicated by logical "low" for ϕ1s). Input switches remain closed (as indicated by logical "high" for ϕ1). During time period 3, input switches open as well (as indicated by logical "low" for ϕ1) to complete sampling or charge acquisition onto first capacitor Cs 201 and second capacitor Cs 202. Time periods 1-3 can thus be considered the sampling phase, where charge is trapped on multiple capacitors using bottom plate sampling. During time period 4, transfer switches are closed (as indicated by logical "high" for ϕxfer) to implement charge transfer. Note that subtraction and gain is implemented during charge transfer. Time period 4 can thus be considered a charge transfer phase, where capacitors are stacked in series to sum the trapped charges, and the DAC output is coupled to the capacitors to perform subtraction.

The CP gain circuit 200 receives complementary analog input signals Vin+ and Vin−, and complementary DAC output signals Vdac+ and Vdac−. The DAC 106 seen in FIG. 2 generates (complementary) signals on the complementary outputs Vdac+ and Vdac− based on a digitized version of the complementary analog input signals (e.g., digital output from ADC 104 of FIG. 1 digitizing Vin+ and Vin−). Therefore, the signals on the complementary outputs of the DAC 106, Vdac+ and Vdac−, represent a reconstructed analog input signal (Vin' of FIG. 1). Using the timing seen in FIG. 3, the CP gain circuit 200 illustrated in FIG. 2 can implement subtraction (e.g., Vin−Vin' of FIG. 1) and gain (e.g., 2× gain on Vin−Vin' of FIG. 1) of signals, which are functions found in an MDAC.

The design of CP gain circuit 200 relies upon DAC 106 to provide a voltage Vdac to level shift the stacked capacitors (e.g., first capacitor Cs 201 and second capacitor Cs 202), i.e., the sampled voltages on the stacked capacitors, to implement subtraction. Specifically, the voltage Vdac is presented to the bottom plate of the second capacitor Cs 202 to implement level shifting. Based on Vin and Vin' (or Vdac), the CP gain circuit 200 performs subtraction and gain, and outputs complementary signals at complementary output nodes Vout− and Vout+, which are representative of an amplified residue Vout of an MDAC 102 seen from FIG. 1. Mathematically, the CP gain circuit 200 implements Vout=2*Vin−Vdac. Note the DAC reference is scaled proportional to the gain (e.g., 2×) for the math to be correct, thus the ADC 104 has references +Vref and −Vref, and DAC 106 has references +2 Vref and −2 Vref. Phrased differently, the circuit amplifies the input signal, and thus the DAC references are increased proportional to the amount of signal gain on the input signal (e.g., 2×).

A Switched Capacitor MDAC Combining CP Gain and Capacitive DAC

Different DAC circuit architectures can be used for DAC 106 of FIG. 1 to generate the DAC output.

In some cases, a current mode DAC with a resistor load as can be used to generate a voltage signal as input to the CP gain circuit. The current mode DAC and resistor code can implement a current to voltage DAC for DAC 106. However, such a DAC design can become non-linear depending on the full scale and code. Effectively, if the attempt is to avoid the difficulty of designing a linear feedback amplifier for the residue amplifier 110 of MDAC 102 on a voltage supply of <1V, then the headroom problem has been moved from the residue amplifier 110 to the DAC design.

In some cases, a resistor ladder DAC can be implemented for DAC 106. Linearity problem can be avoided. However, the multiplexing that is needed to select the proper reference tap in the resistor ladder can become unwieldy beyond a simple 1.5 b per stage implementation.

To address some of the shortcomings above, the function of DAC 106 of FIG. 2 can be implemented as a capacitive charge redistribution based circuit, which is folded into or integrated into a circuit implementing CP gain. The resulting MDAC circuit is a non-trivial improvement over other MDAC circuit designs. Specifically, the resulting MDAC circuit utilizes charge redistribution and open loop charge pump gain in ways that have not been done together before.

Figure 4:
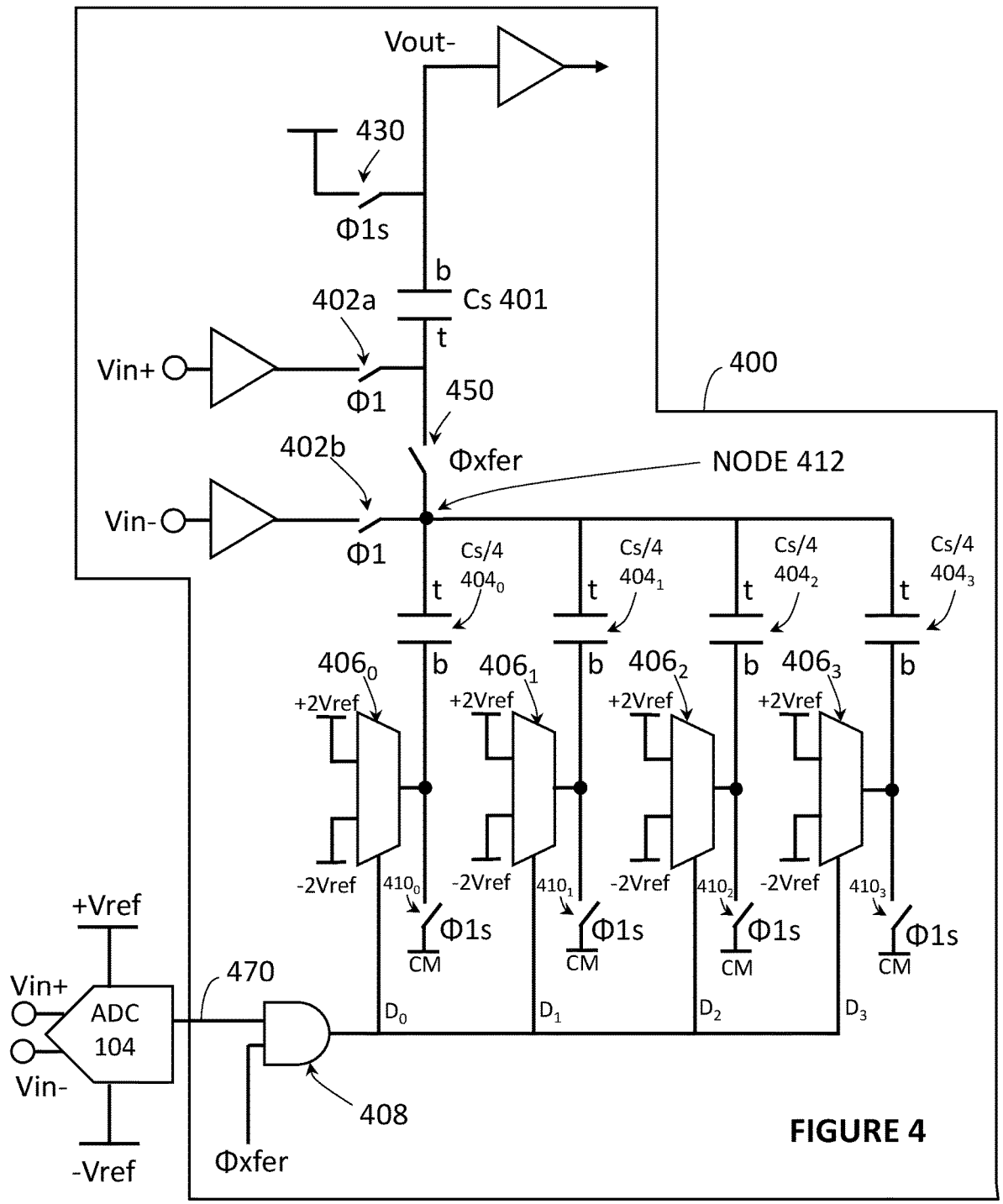
FIG. 4 shows a switched capacitor multiplying digital-to-analog converter (MDAC) with open loop gain, according to some embodiments of the disclosure.

FIG. 4 shows a switched capacitor multiplying digital-to-analog converter (MDAC) with open loop gain, according to some embodiments of the disclosure. The switched capacitor MDAC is shown within the context of a stage in a pipelined ADC having ADC 104 and the switched capacitor MDAC 400 where ADC 104 receives complementary analog input signals Vin+ and Vin−, and generates an output code 470. The output code 470 is a quantized or digitized version of the complementary analog input signals Vin+ and Vin−, and the output code 470 can be provided as input to the switched capacitor MDAC 400. The output code 470 can be thermometer coded. The output code 470 can include a plurality of bits, $D_0 \ldots D_{N-1}$. In this example, the output code has four bits: $D_0$, $D_1$, $D_2$, and $D_3$. The output code is received from ADC 104.

The switched capacitor MDAC 400 includes a bank of capacitors. In the example shown, four equally sized/weighted capacitors are included in the bank of capacitors: capacitor $404_0$ having weight Cs/4, capacitor $404_1$ having weight Cs/4, capacitor $404_2$ having weight Cs/4, and capacitor $404_1$ having weight Cs/4. Broadly speaking, the bank of capacitors can include N capacitors having weight Cs/N. The sum of the weights of the capacitors is equal to the nominal weight Cs. The capacitors in the bank of capacitors are in a parallel configuration with each other. The bank of capacitors can serve as a capacitive DAC responsive to the output code 470. Moreover, the bank of capacitors can implement charge redistribution. Charge redistribution means that when the capacitors, such as the ones in the bank of capacitors, are connected in parallel, the different charges captured on the capacitors would redistribute themselves in a way to make sure that the voltage across each capacitor are equal to each other.

Each capacitor in the bank of capacitors has a first plate and a second plate. The first plate is labeled "b", short for "bottom" plate. The second plate is labeled "t" short for top plate. Each one of the first plates (of the capacitors) of the bank of capacitors is connectable to a common mode voltage, a first voltage reference, and a second voltage reference. The common mode voltage is shown as "CM". For this example shown, the first voltage reference is +2 Vref, the second voltage reference is −2 Vref. For instance, the bottom plate of capacitor $404_0$ can be connected to +2 Vref, −2 Vref, or CM. The second plates (of the capacitors) of the bank of capacitors are connected to a common node, node 412, which is connectable to receive a first one of complementary analog input signals Vin−. With this configuration, the second plates of the bank of capacitors are connectable to Vin−. Input switch 402b, when closed, can connect the common node, node 412, to the first one of the complementary analog input signals Vin−.

The switched capacitor MDAC 400 further includes a gain capacitor Cs 401, having the nominal weight Cs, having a first plate (labeled "t" for top plate) connectable to receive a second one of the complementary analog input signals Vin+, and a second plate (labeled "b" for bottom plate) at a first complementary output Vout− of the switched capacitor MDAC 400. Input switch 402a, when closed, can connect the first (or top) plate of the gain capacitor to the second one of the complementary analog input signals Vin+.

The switched capacitor MDAC 400 further includes sample switches to connect first (or bottom) plates of the bank of capacitors to the common mode voltage. In the example shown, sample switch $410_0$ can connect the bottom plate of capacitor $404_0$ to CM. Sample switch $410_1$ can connect the bottom plate of capacitor $404_1$ to CM. Sample switch $410_2$ can connect the bottom plate of capacitor $404_2$ to CM. Sample switch $410_3$ can connect the bottom plate of capacitor $404_3$ to CM. The switched capacitor MDAC 400 further includes a sample switch 430 to connect the second (bottom) plate of the gain capacitor Cs 401 to ground. Sample switches are provided to implement bottom plate sampling.

The switched capacitor MDAC 400 further includes multiplexers (or suitable switching circuitry), e.g., multiplexer $406_0$, multiplexer $406_1$, multiplexer $406_2$, and multiplexer $406_3$, to connect the first voltage reference (e.g., +2 Vref) or the second voltage reference (e.g., −2 Vref) to respective first (or bottom) plates based on the output code 470. The multiplexers allow the output code 470 to control the bank of capacitors being used as a capacitive DAC. In the example shown, multiplexer $406_0$ can select +2 Vref or −2 Vref based on bit $D_0$ of the output code 470, and connect the selected voltage reference to the bottom plate of capacitor $404_0$. Multiplexer $406_1$ can select +2 Vref or −2 Vref based on bit $D_1$ of the output code 470, and provide the selected voltage reference to the bottom plate of capacitor $404_1$. Multiplexer $406_2$ can select +2 Vref or −2 Vref based on bit $D_2$ of the output code 470, and provide the selected voltage reference to the bottom plate of capacitor $404_2$. Multiplexer $406_3$ can select +2 Vref or −2 Vref based on bit $D_3$ of the output code 470, and provide the selected voltage reference to the bottom plate of capacitor $404_3$. Depending on the output code 470, the bottom plates can be selectively connected to +2 Vref or −2 Vref. The output code 470 can be gated by gate 408 (or suitable switching circuitry), which makes the output code 470 available to make the selections in response to control signal ϕxfer.

The switched capacitor MDAC 400 further includes a transfer switch 450 to connect the common node, node 412, to the first plate of the gain capacitor Cs 401. The transfer switch 450 is positioned between the second (or top) plates of the bank of capacitors and the first (or top) plate of the gain capacitor 410. When closed, the transfer switch 450 can connect the top plates of the bank of capacitors to the top plate of the gain capacitor Cs 401. Connecting the top plates of the bank of capacitors to the top plate of the gain capacitor Cs 401 can implement stacking or gain. The charges in the gain capacitor and in the bank of capacitors are summed or added when stacked. Mathematically, the switched capacitor MDAC implements gain and subtraction as before: Vout=2*Vin−Vin', and the capacitive DAC references (e.g., +2 Vref and −2 Vref) is scaled proportionally to the gain applied to the input signal (e.g., 2×).

The switched capacitor MDAC 400 can follow the timing and phases, e.g., the three control signals ϕ1s, ϕ1, and ϕxfer, as seen in FIG. 3. The control signals are shown next to the corresponding switches and gate 408 in FIG. 4. The control signals have different timings for operating the switched capacitor MDAC 400 of FIG. 4.

During time period 1, input switches 402a and 402b, sample switch 430, and sample switches $410_0$-$410_3$ are closed (as indicated by logical "high" for ϕ1s, and ϕ1). Input switch 402a connects the top plate of gain capacitor Cs 401 to Vin+. Input switch 402b connects the (common) node 412 to Vin−. Sample switch 430 connects the bottom plate of gain capacitor Cs 401 to ground. Sample switches $410_0$-$410_3$ connect the bottom plates of the bank of capacitors to CM. Transfer switch 450 is open (as indicated by logical "low" for ϕxfer). To implement bottom plate sampling, during time period 2, sample switch 430 and sample switches $410_0$-$410_3$ open (as indicated by logical "low" for ϕ1s). Input switches 402a and 402b remain closed (as indicated by logical "high" for ϕ1). During time period 3, input switches 402a and 402b open as well (as indicated by logical "low" for ϕ1) to complete sampling or charge acquisition onto gain capacitor Cs 401 and the capacitors $404_0$-$404_3$ of the bank of capacitors. Time periods 1-3 can thus be considered the sampling phase, where charge is trapped on gain capacitor and the capacitors in the capacitive DAC using bottom plate sampling. During the sampling phase, the input signal would be present on the top plate of the gain capacitor and the top plates of the bank of capacitors. The top plate of the gain capacitor and the top plates of the bank of capacitors acquire the input signal.

During sample phase, ADC 104 can perform analog-to-digital conversion of the complementary analog input signals Vin+ and Vin− and generate output code 470. As mentioned previously, output code 470 can be thermometer coded. In the example shown, the output code 470 can have four bits. Each bit can have one of two states. For example, the output code 470 can have exemplary values ranging from 0 0 0 0 to 1 1 1 1. In one instance, if the complementary analog inputs signals are at a differential zero, then the output code 470 can have values 0 0 1 1.

During time period 4, control signal ϕxfer controls gate 408 to provide output code 470 to the capacitive DAC (as indicated by logical "high" for ϕxfer). The output code 470 controls the multiplexers $406_0$-$406_3$ accordingly. Depending on the state of the respective bit $D_i$ of the output code 470 controlling the respective multiplexer $406_i$, the bottom plate of the respective capacitor $404_i$ can be connected to +2 Vref or −2 Vref. Effectively, the output code 470 from ADC 104 controlling the bank of capacitors operating as a capacitive DAC implements a ratio of capacitances that corresponds to a DAC voltage level representing the output code 470. The DAC voltage level can range between +2 Vref to −2 Vref. If the output code 470 is 0 0 1 1, the bank of capacitors operating as a capacitive DAC can implement a DAC voltage level of zero (or midscale), by connecting bottom plates of capacitors $404_0$ and $404_1$ to +2 Vref and connecting bottom plates of capacitors $404_2$ and $404_3$ to −2 Vref. If the output code 470 is 1 1 1 1, the bank of capacitors operating as a capacitive DAC can implement a DAC voltage level of +2 Vref, by connecting bottom plates of capacitors $404_0$-$404_3$ to +2 Vref. If the output code 470 is 0 0 0 0, the bank of capacitors operating as a capacitive DAC can implement a DAC voltage level of −2 Vref, by connecting bottom plates of capacitors $404_0$-$404_3$ to −2 Vref.

Instead of generating an ideal voltage Vdac using a separate DAC 106 as seen in FIG. 2, the DAC voltage level for level shifting the stacked capacitors is effectively (internally) generated through connecting the bottom plates of the capacitors $404_0$-$404_3$ to either +2 Vref or −2 Vref based on the output code 470 and through charge redistribution occurring in the bank of capacitors. Effectively, the bank of capacitors are implementing both sampling and digital-to-analog conversion.

Also, during time period 4, transfer switch 450 is closed (as indicated by logical "high" for ϕxfer) to implement charge transfer. Note that subtraction and gain are implemented during charge transfer. Time period 4 can thus be considered a charge transfer phase. The gain capacitor and the bank of capacitors are stacked in series to sum the trapped charges to implement gain. The bank of capacitors are effectively level shifted based on the output code 470 and charge redistribution to implement subtraction. During charge transfer, node 412 is a high impedance node (and not virtual ground). The gain functionality of the switched capacitor MDAC is implemented through an open loop circuit by stacking capacitors, and is not implemented through a closed loop circuit involving an operational amplifier and a feedback capacitor.

Figure 5:
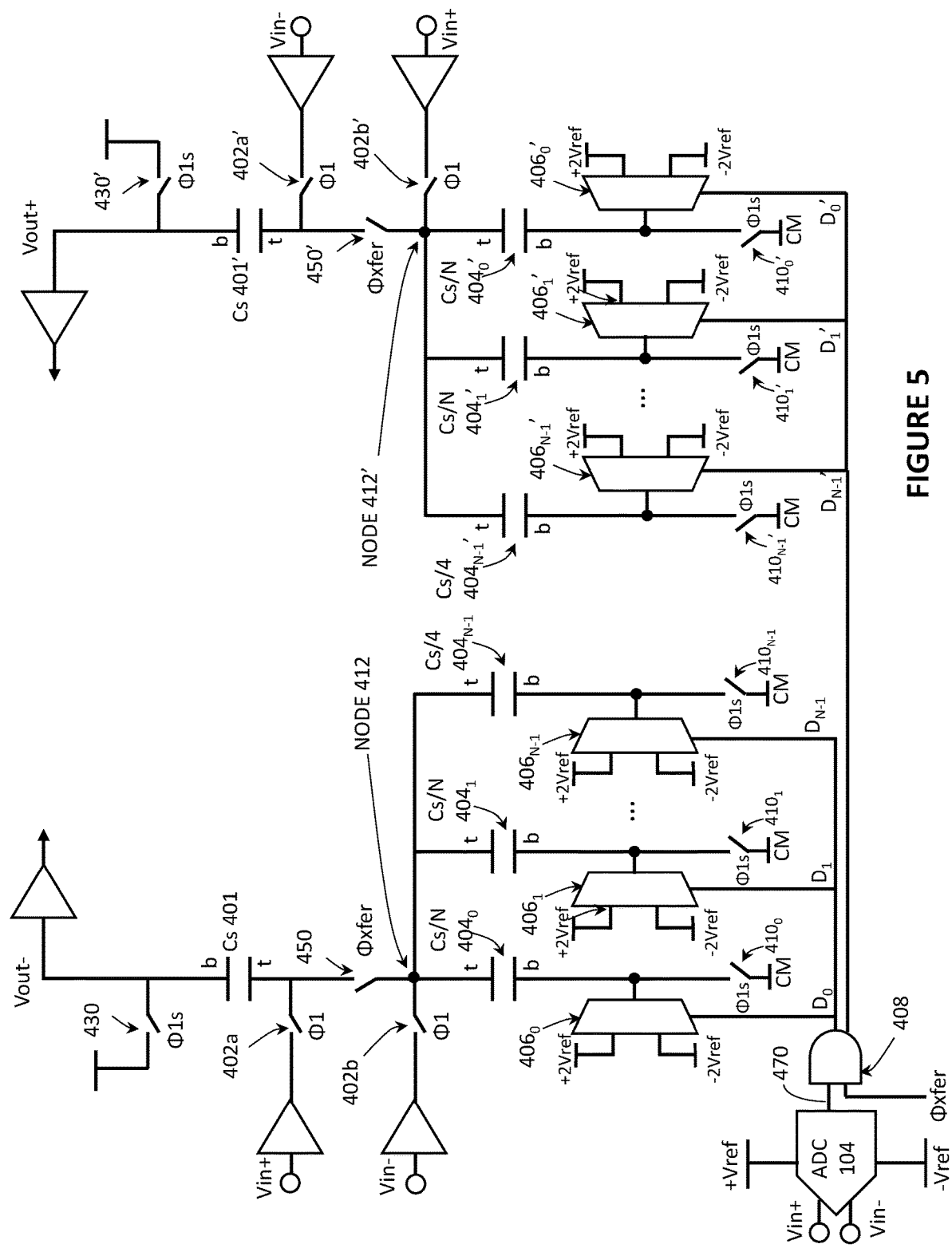
FIG. 5 shows a full differential switched capacitor multiplying digital-to-analog converter (MDAC) with open loop gain, according to some embodiments of the disclosure.

FIG. 4 only shows one part of the differential circuit implementation of a switched capacitor MDAC. FIG. 5 shows a full differential switched capacitor multiplying digital-to-analog converter (MDAC) with open loop gain, according to some embodiments of the disclosure. FIG. 5 also generalizes the implementation to N capacitors in the bank of capacitors. Complementary circuitry are provided in addition to the circuitry seen in FIG. 4. For instance, the complementary circuitry includes a further bank of capacitors comprising capacitors $404_1'$ to $404_{N-1}'$, a further gain capacitor Cs 401', and a further transfer switch 450'. The complementary circuitry can include further input switches 402a' and 402b', sample switch 430' and sample switches $410_1'$-$410_{N-1}'$. The complementary circuitry can further include multiplexers $406_1'$-$406_{N-1}'$, but the multiplexers are controlled by a complementary version of the output code 470, or bits $D_0'$-$D_{N-1}'$ respectively. The bottom plate of gain capacitor Cs 401' is at a second complementary output Vout+ of the switched capacitor MDAC.

Output Circuits

Figure 6A:
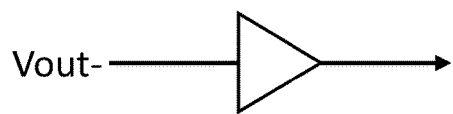
FIG. 6A shows a buffer at an output of the switched capacitor multiplying digital-to-analog converter, according to some embodiments of the disclosure.
Figure 6B:
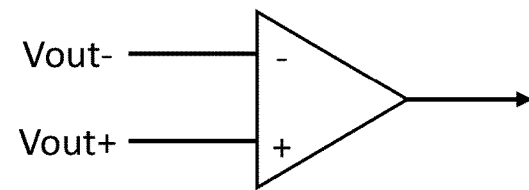
FIG. 6B shows a comparator at outputs of the switched capacitor multiplying digital-to-analog converter, according to some embodiments of the disclosure.
Figure 7:
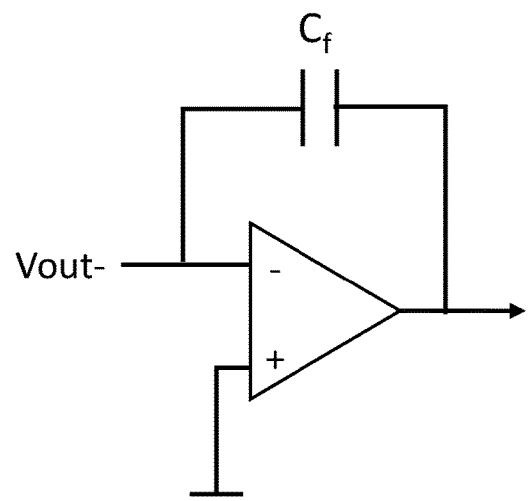
FIG. 7 shows a closed loop amplifier at an output of the switched capacitor multiplying digital-to-analog converter, according to some embodiments of the disclosure.

At the output nodes of the switched capacitor MDAC, different buffering circuit structures can be included to buffer the output signals Vout− and Vout+ and isolate the switched capacitor MDAC with circuitry in a following stage of the pipelined ADC. In one instance, the switched capacitor MDAC can include a buffer at the first complementary output of the switched capacitor MDAC Vout− and/or a buffer at the second complementary output of the switched capacitor MDAC Vout+. The buffer can be a unity gain amplifier. An exemplary buffer is shown in FIG. 6A. In some cases, the switched capacitor MDAC can include an open loop amplifier at the first complementary output of the switched capacitor MDAC Vout− and/or an open loop amplifier at the second complementary output of the switched capacitor MDAC Vout+. In some cases, the switched capacitor MDAC can include a comparator that receives the first and second complementary outputs (Vout− and Vout+) of the switched capacitor MDAC. An exemplary comparator is shown in FIG. 6B. In some cases, the switched capacitor MDAC can include a closed loop amplifier at the first complementary output of the switched capacitor MDAC Vout− and/or a closed loop amplifier at the second complementary output of the switched capacitor MDAC Vout+. A closed loop amplifier is shown in FIG. 7. Different circuit structures at the output processing the output signals Vout− and Vout+ can affect the MDAC design, such as speed of the MDAC circuit. The choice of the circuit structure is not trivial, and can depend on application requirements.

Various output circuits, such as the ones illustrated in FIGS. 6A-6B, and 7 can generate a single-ended output or a differential/complementary output.

Advantages of the Switched Capacitor MDAC

The switched capacitor MDAC has many advantages. For instance, the circuit topology seen in FIGS. 4 and 5 has an added benefit of being able to decouple the analog input voltage common mode (common mode of Vin+ and Vin−) with the output common mode (common mode of Vout− and Vout+). The circuit topology can also decouple the analog input voltage common mode from the common mode of the capacitive DAC folded into the topology. Specifically, the circuit topology is able to achieve decoupling of common modes because the input signal is acquired on one side of the capacitors (e.g., the top plates of capacitors) within the circuit, and the output nodes and the effective DAC voltage level are present on the other side of the capacitors. Note that the input switches are positioned on the top plates of the gain capacitor and the top plates of the bank of capacitors (node 412). The output node is at the bottom plate of the gain capacitor, and the voltage references for the capacitive DAC are connectable to the bottom plates of the bank of capacitors. The transfer switch is at the top plate of the gain capacitor and the top plates of the bank of capacitors (node 412). The gain capacitor and the bank of capacitors effectively decouple the different common modes that may be present in the circuit. The capacitors and switches of the switched capacitor MDAC are uniquely positioned to isolate the three different common mode domains. As a result the different common modes can be independent of each other. Decoupling of common modes mean that the different common modes no longer have to be compatible with each other.

This capability of decoupling of common modes can be beneficial in several ways. First, the decoupling of common modes allow the different parts of overall circuitry to have different common modes, thereby relaxing the design requirements on each part. In pipelined ADCs, the different parts are often cascaded, one after another, therefore the issue of common mode compatibility between cascaded parts of circuits is particularly significant. Moreover, relaxing design requirements on each part can alleviate some of the challenges in designing for circuits operating in smaller geometries and with reduced supply voltages. Second, the decoupling of common modes means that level shifters between different parts of the overall circuitry are no longer needed. With the decoupling of common modes, the complementary output signals Vout− and Vout+ can be provided to the following stage in the pipelined ADC without a level shifter. The complementary analog input signals (Vin+ and Vin−) are provided by a previous stage in a pipelined ADC (the Vout− and Vout+ of a previous stage). With the decoupling of common modes, the complementary analog input signals (Vin+ and Vin−) can be provided from the previous stage in the pipelined ADC without a level shifter. Level shifters are often required to make sure the common modes are corrected or adjusted to ensure the next part of the circuit remain linear. Level shifters can increase noise, decrease gain, increase distortions, and increase complexity. Therefore, avoiding the need to include level shifters can greatly improve the overall circuit design and performance.

Note that (1) sampling of the complementary analog input signals Vin+ and Vin− onto the top plates of the gain capacitor and the capacitors in the bank of capacitors, and (2) stacking of the gain capacitor and the bank of capacitors through the transfer switch can ensure the gain on the input common mode error is zero. Specifically, common mode error/variations can be rejected by the differential circuit setup (e.g., as seen in FIGS. 5-6). Any error in the input common mode is not amplified, and input common mode errors do not grow in the stages of a pipelined ADC.

Another advantage of the switched capacitor MDAC design is that a multi-bit per stage pipelined architecture is easier to achieve. It can be easier to get higher precision with a capacitive DAC, which is dependent on a ratio of capacitors, than with a voltage DAC. Accordingly, the switched capacitor MDAC design makes it possible to create a linear DAC without being constrained to a 1 bit or 1.5 bit effective stage. When used with a passive open loop CP gain circuit, the capacitive DAC avoids headroom limitations, switching complexity, and nonlinearity issues usually associated with to voltage DACs. When used in conjunction with a feedback amplifier at the output for buffering Vout+ and Vout−, particularly for a multi-bit per stage configuration, the circuit improves noise gain by improving feedback factor β. The switched capacitor MDAC outputs Vout+ and Vout− can be buffered by e.g., unity gain buffers, open loop amplifiers, and closed loop amplifiers, and the choice of output circuit can depend on the application requirements.

Figure 8:
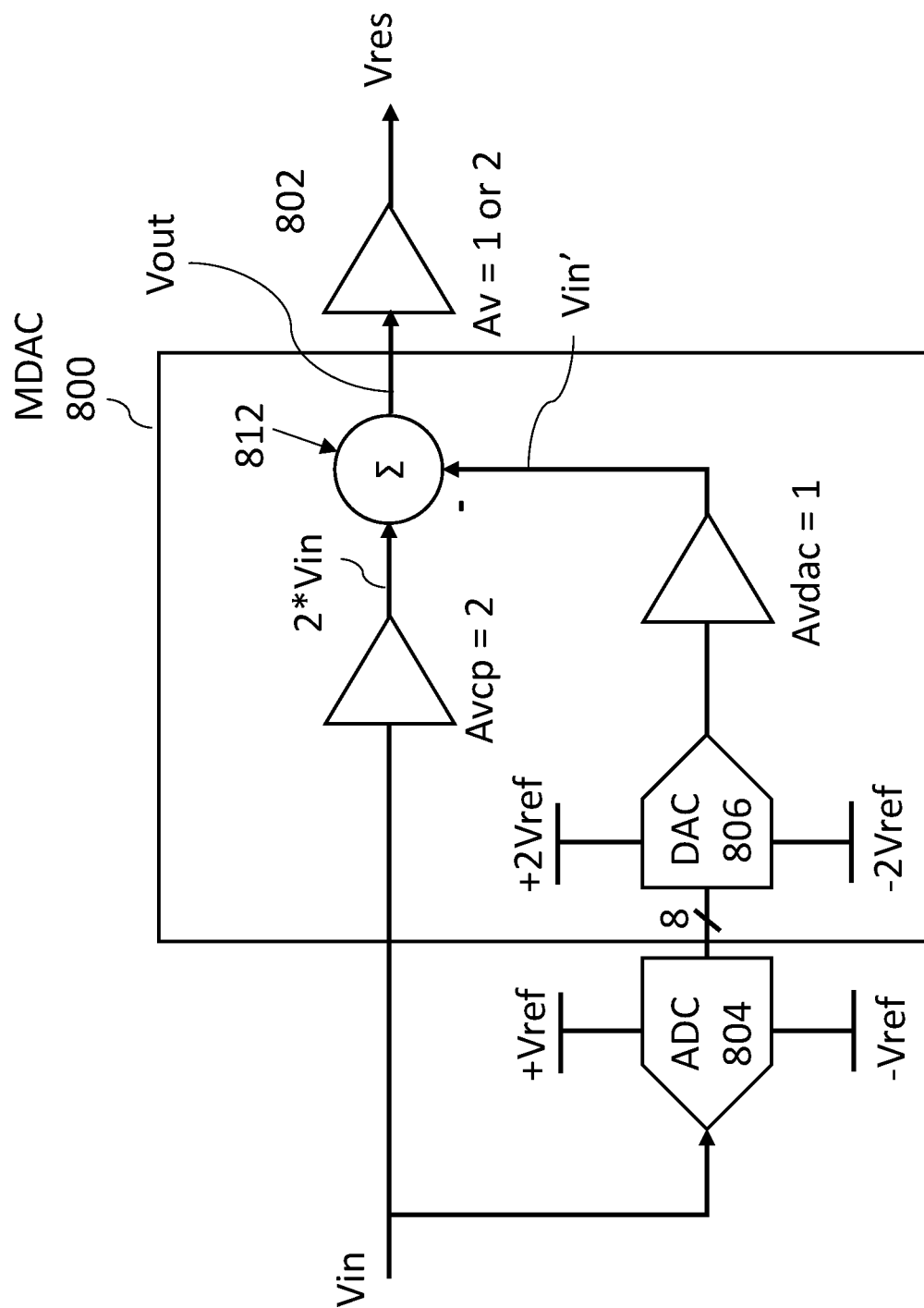
FIG. 8 illustrates a stage in a pipelined analog-to-digital converter, according to some embodiments of the disclosure.

FIG. 8 illustrates a stage in a pipelined analog-to-digital converter, according to some embodiments of the disclosure. The stage is implemented based on the switched capacitor MDAC illustrated in FIGS. 4 and 5. The stage is a 2.5 b effective stage, where the ADC 804 produces eight bits for the output code, and the MDAC 800 has a 2.5 b capacitive DAC 806. The MDAC 800 implements 2 Vin−Vin', where the input Vin is gained by 2×, and Vin' is generated through the capacitive DAC (illustrated as DAC 106). The 2.5 b capacitive DAC 806 generating Vin' operates with voltage references proportional to the gain on the input Vin. Accordingly, the voltage references for ADC 804 is +Vref and −Vref, and the voltage references for the capacitive DAC 806 is +2 Vref and −2 Vref. The MDAC subtraction function 812 is implemented in the same manner as described with FIGS. 4 and 5 to obtain the residue Vout. Optionally, the output of MDAC 800 can include a unity gain buffer, an open loop amplifier of gain 2×, or a closed loop amplifier of gain 2×, etc.

Yet another advantage of the switched capacitor MDAC is the feature of passive open loop CP gain. The CP gain design of the switched capacitor MDAC can be beneficial in architectures where it has become more difficult to implement linear, low power, closed loop amplifiers. In smaller geometries, switched capacitor circuits can be easier to design, or they can be more adaptable to calibration to achieve the desired performance.

Methods for Residue Generation

FIG. 9 is a flow diagram illustrating a method for residue generation, according to some embodiments of the disclosure. In 902, during a sample phase, a first one of complementary analog input signals (e.g., Vin+) is connected to a first plate (e.g., top plate) of gain capacitor (e.g., Cs 401) and a second one of complementary analog input signals (e.g., Vin−) is connected to a common node connecting first plates (e.g., top plates) of capacitors within a capacitive digital-to-analog converter (e.g., node 412). In 904, during a charge transfer phase, the first plate of the gain capacitor is connected to the common node, each one of second plates (e.g., bottom plates) of the capacitors within the capacitive digital-to-analog converter are connected to a first reference or a second reference based on an output code controlling the capacitor digital-to-analog converter, and a residue signal is output at a second plate of the gain capacitor.

Figure 10:
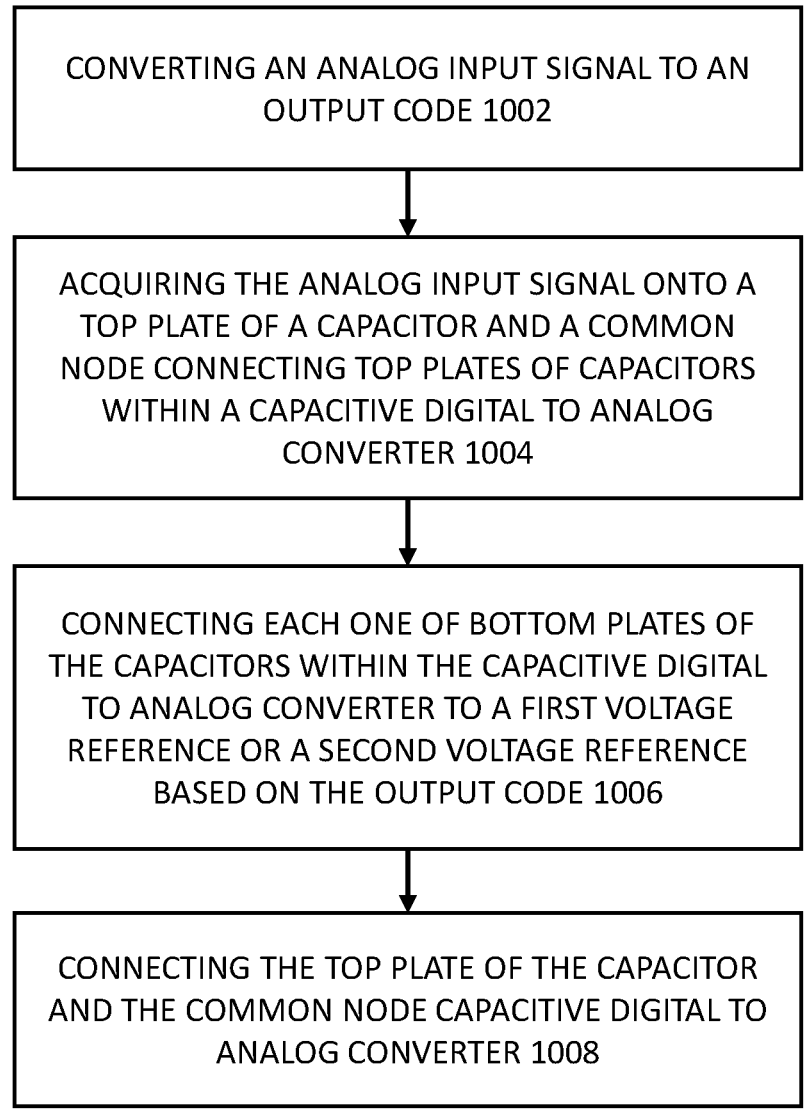
FIG. 10 is a flow diagram illustrating a method for generating a residue in a pipelined analog-to-digital converter, according to some embodiments of the disclosure.

FIG. 10 is a flow diagram illustrating a method for generating a residue in a pipelined analog-to-digital converter, according to some embodiments of the disclosure. In 1002, an analog input signal is converted to an output code (e.g., output code 470). In 1004, the analog input signal is acquired onto a top plate of a capacitor (e.g., Cs 401) and a common node (e.g., node 412) connecting top plates of capacitors within a capacitive digital-to-analog converter. In 1006, each one of bottom plates of the capacitors within the capacitive digital-to-analog converter are connected to a first voltage reference (e.g., +2 Vref) or a second voltage reference (e.g., −2 Vref) based on the output code. In 1008, the top plate of the capacitor is connected to the common node capacitive digital-to-analog converter.

Comparators and Differential Comparators

While the examples herein are related to residue generation involving subtraction and amplification, it is appreciated that the exemplary switched capacitor circuits can extend beyond residue generation in a pipeline ADC. The functionalities of subtraction and amplification to generate an amplified residue are also implemented in comparators. Therefore, the switched capacitor circuits can be used to build a differential comparator and the switched capacitor circuits can be replicated to build a bank of differential comparators. The advantages such as ones from decoupling common modes can be extended to differential comparators implemented using the described switched capacitor circuits.

It is common for ADC architectures to include a differential comparator or a bank of differential comparators. A differential comparator can compare a differential/complementary analog input signal against a differential/complementary reference signal, and output a difference between the differential/complementary analog input signal and the differential/complementary reference signal. If desired, the differential comparator can implement unity gain or non-unity gain/amplification on the difference as well. Differential comparator can be found in other ADCs such as successive-approximation-register ADCs or delta-sigma modulators. If a bank of comparators are implemented, the bank of comparators can compare a differential/complementary analog input signal against respective differential/complementary reference signals (e.g., Vref1+ & Vref1−, Vref2+ & Vref2−, and so on). A bank of differential comparators, i.e., a flash ADC, can be found in pipeline converters for fast, quantization. The differential/complementary reference signal(s) (e.g., Vref1+ & Vref1−, Vref2+ & Vref2−, and so on) can be generated by a reference circuit.

Figure 11:
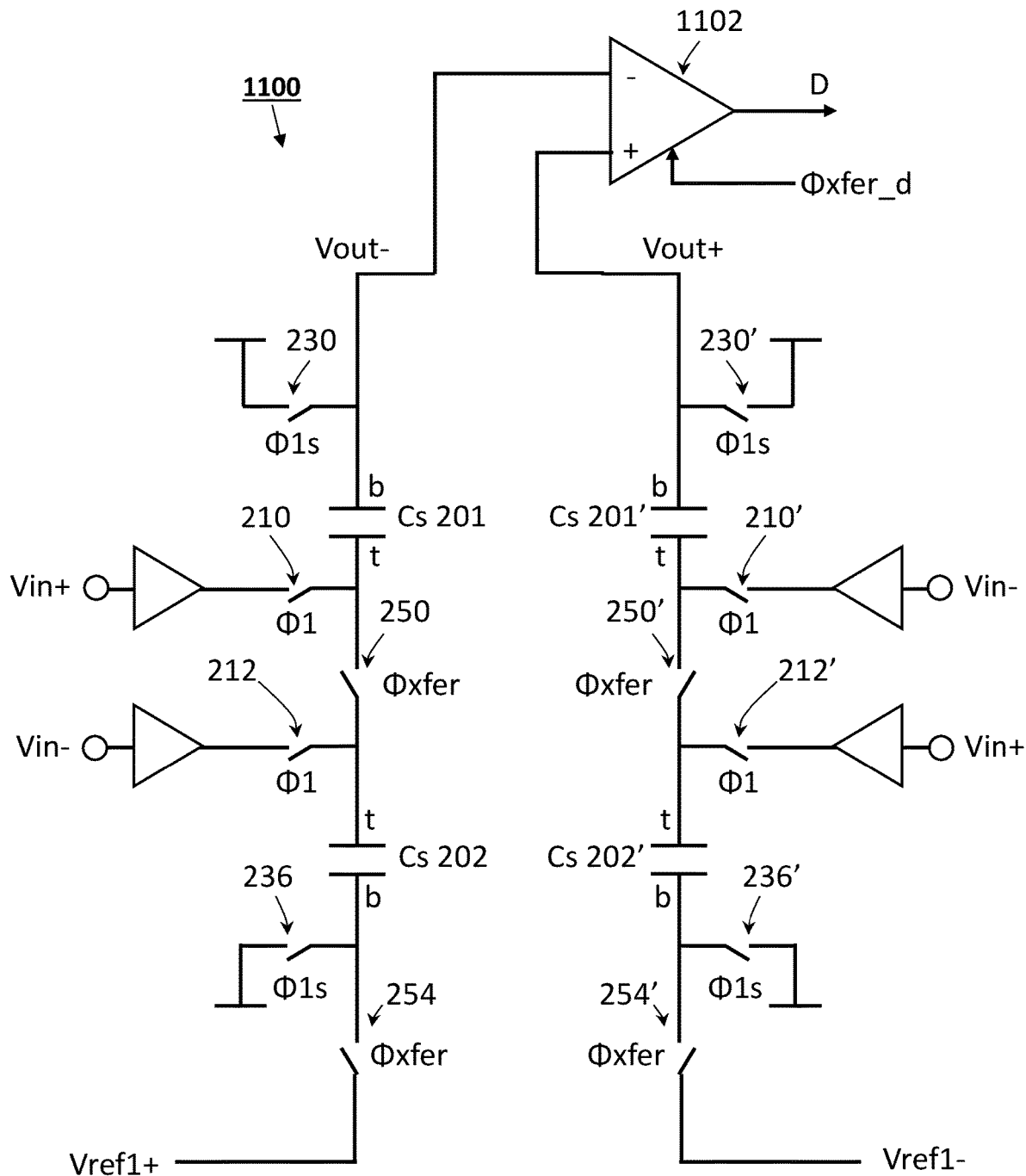
FIG. 11 shows an exemplary differential comparator, according to some embodiments of the disclosure.

The CP gain circuit 200 seen in FIG. 2 can be adapted to build a differential comparator which compares a differential/complementary analog input signal (e.g., Vin+ and Vin−) against a differential/complementary reference signal (e.g., Vref1+ and Vref1−). FIG. 11 shows an exemplary differential comparator, according to some embodiments of the disclosure. Vdac+ and Vdac− of FIG. 2 are replaced by differential/complementary reference voltages Vref1+ and Vref1− (which can be generated by a reference circuit). Moreover, the differential comparator 1100 includes a comparator 1102 that receives the first and second complementary outputs (Vout− and Vout+) as inputs, and outputs a decision D of the differential comparator 1100. The comparator 1102 can include a differential amplifier. The comparator 1102 can have a latch to latch the result of the differential amplifier to generate a comparator decision D. In the left side of FIG. 11 is a first part of the differential comparator 1100 (a first CP gain circuit), and on the right side of FIG. 11 is a second, complementary part of the differential comparator 1100 (a second CP gain circuit).

The first part of the differential comparator 1100 is similar to CP gain circuit 200. The first part of the differential comparator 1100 has a first capacitor Cs 201 having a top plate receive a first complementary analog input signal (Vin+) via the first input switch 210, and a bottom plate to output a first complementary output (Vout−). First capacitor Cs 201 is between first input switch 210 for coupling the first complementary analog input signals (Vin+) to top plate of the first capacitor Cs 201 and the first complementary output node (Vout−). In other words, Vin+ is on one side/plate (top plate) of first capacitor Cs 201, Vout− is on the other side/plate (bottom plate) of first capacitor Cs 201. The first part of the differential comparator 1100 also has a second capacitor Cs 202 having a top plate to receive a second complementary analog input signal (Vin−) and a bottom plate to receive a first complementary reference voltage (Vref1+). The second capacitor Cs 202 is between second input switch 212 for coupling the second complementary analog input signals (Vin−) to the top plate of the second capacitor Cs 202 and transfer switch 254 for coupling the bottom plate of the second capacitor Cs 202 to the first differential/complementary reference voltage (Vref1+ in this example). In other words, Vin+ is on one side/plate (top plate) of second capacitor Cs 202, Vref1+ is on the other side/plate (bottom plate) of second capacitor Cs 202. A transfer switch 250 is between first capacitor Cs 201 and second capacitor Cs 202, and closing the transfer switch 250 can sum charges captured or sampled on the first capacitor Cs 201 and second capacitor Cs 202. When the transfer switch 250 is closed, the first capacitor Cs 201 and the second capacitor Cs 202 are stacked. The transfer switch 250 connects/shorts the top plate of the first capacitor Cs 201 to the top plate of the second capacitor Cs 202. The transfer switch 250 is on the same side/plate (top plate) of the first capacitor Cs 201 as the first input switch 210; the transfer switch 250 is also on the same side/plate (top plate) of the second capacitor Cs 202 as the second input switch 212. The analog input signal is acquired by sampling the analog input signal onto the top plate of the first and second capacitors. The charges are summed, optionally to implement gain, by stacking the first and second capacitors (shorting the top plates of the first and second capacitors). Subtraction occurs through level shifting, which is done by connecting the bottom plate of the second capacitor Cs 202 to the first differential/complementary reference voltage Vref1+. Accordingly, the first charge pump gain circuit compares the analog input signal against a reference voltage.

The second, complementary part of the differential comparator 1100 (a second CP gain circuit) is complementary to the first part of the differential comparator 1100, and the second, complementary part outputs a second complementary output (Vout+). The second, complementary part of the differential comparator 1100 includes a third capacitor Cs 201' having a top plate to receive the second complementary analog input signal [Vin−] and a bottom plate to output the second complementary output (Vout+). The third capacitor Cs 201' is between a third input switch 210' for coupling the second complementary analog input signal (Vin−) to the top plate of the first capacitor Cs 201' and the second complementary output nodes of the CP gain circuit (Vout+). In other words, Vin− is on one side/plate (top plate) of third capacitor Cs 201', Vout+ is on the other side/plate (bottom plate) of third capacitor Cs 201'. The third capacitor Cs 202' is between a fourth input switch 212' for coupling the first complementary analog input signals (Vin+) to the top plate of the fourth capacitor Cs 202' and transfer switch 254' for coupling the bottom plate of the fourth capacitor Cs 202' to the second differential/complementary reference voltage (Vref1− in this example). In other words, Vin+ is on one side/plate (top plate) of fourth capacitor Cs 202', Vref1− is on the other side/plate (bottom plate) of second capacitor Cs 202'. A second transfer switch 250' is between third capacitor Cs 201' and fourth capacitor Cs 202', and closing the transfer switch 250' can sum charges captured or sampled on the third capacitor Cs 201' and fourth capacitor Cs 202'. When the second transfer switch 250' is closed, the third capacitor Cs 201' and the fourth capacitor Cs 202' are stacked. The second transfer switch 250' connects/shorts the top plate of the third capacitor Cs 201' to the top plate of the fourth capacitor Cs 202'. The second transfer switch 250' is on the same side/plate (top plate) of the third capacitor Cs 201' as the third input switch 210'; the second transfer switch 250' is also on the same side/plate (top plate) of the fourth capacitor Cs 202 as the fourth input switch 212'. The analog input signal is acquired by sampling the analog input signal onto the top plates of the third and fourth capacitors. The charges are summed, optionally to implement gain, by stacking the third and fourth capacitors (shorting the top plates of the third and fourth capacitors). Subtraction occurs through level shifting, which is done by connecting the bottom plate of the fourth capacitor Cs 202' to the second differential/complementary reference voltage Vref1−. Accordingly, the second charge pump gain circuit compares the analog input signal against a reference voltage.

The differential comparator can optionally implement bottom plate sampling. Purpose of bottom plate sampling is to reduce input dependent charge from being injected to the sampling capacitor when the input switch opens. Top and bottom plates of first capacitor Cs 201, second capacitor Cs 202, third capacitor Cs 201', fourth capacitor Cs 202' are labeled "t" and "b" respectively. First bottom plate sampling switch 230 and second bottom plate sampling switch 230' implement bottom plate sampling for the first capacitor Cs 201 and third capacitor Cs 201' respectively. Third bottom plate sampling switch 236' and fourth bottom plate sampling switch 236' implement bottom plate sampling for second capacitor Cs 202 and fourth capacitor Cs 202' respectively. In this example, the bottom plate sampling switches 230, 230', 236 and 236' connect the bottom plate of first capacitor Cs 201, second capacitor Cs 202, third capacitor Cs 201', and fourth capacitor Cs 202' to Ground. Complementary analog input signals Vin+ and Vin− can be buffered by respective input buffers (optional).

In the differential comparator 1100, the output signals Vout− and Vout+ are connected to input terminals of comparator 1102, such as the one shown in FIG. 6B to build a differential comparator that compares the differential analog input signal (e.g., Vin+ and Vin−) against suitable differential reference voltages (e.g., Vref1+ and Vref1−). The comparator 1102 can be latched by clock signal ϕxfer_d, which is delayed by an amount of time from the phase of clock signal ϕxfer, to output a comparator decision D at the output of the differential comparator 1100. Clocking the comparator 1102 is optional. The comparator decision D can be a differential/complementary decision (e.g., D+ and D−). The differential comparator 1100 can be duplicated to compare the differential analog input signal against other differential reference voltages to build a bank of differential comparators, i.e., a flash ADC, to quantize the differential analog input signal and output a plurality of decisions representative of the differential analog input signal.

Figure 12:
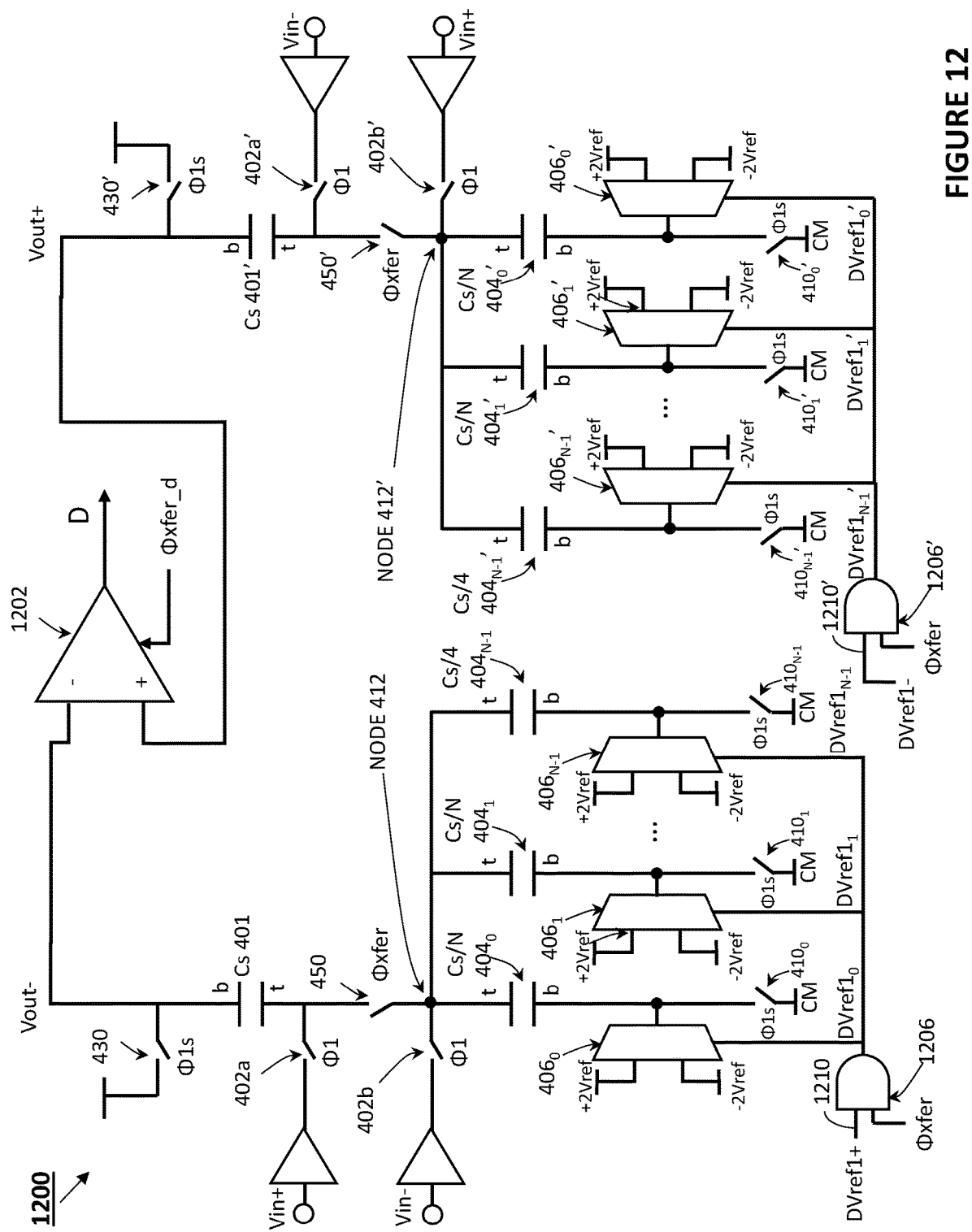
FIG. 12 shows another exemplary differential comparator, according to some embodiments of the disclosure.

The full differential switched capacitor MDAC of FIG. 5 can be adapted to build a differential comparator which compares differential/complementary analog input signals (e.g., Vin+ and Vin−) against a differential/complementary reference signals (e.g., Vref1+ and Vref1−). FIG. 12 shows an exemplary differential comparator 1200, according to some embodiments of the disclosure. The differential comparator 1200 includes a comparator 1202 that receives the first and second complementary outputs (Vout− and Vout+) as inputs, and outputs a decision D of the differential comparator 1200. The comparator 1202 can include a differential amplifier. The comparator 1202 can have a latch to latch the result of the differential amplifier to generate a comparator decision D. In the left side of FIG. 12 is a first circuit of the differential comparator 1200, and on the right side of FIG. 12 is a second, complementary circuit of the differential comparator 1200. The bank of capacitors serving as a capacitive DAC in the first part of the differential comparator 1200 serving as a capacitive DAC is responsive to a code 1210 (DVref1+), comprising a plurality of bits DVref1$_0$ . . . DVref1$_{N-1}$ representative of a first one of the differential/complementary reference voltages (DVref1+=Vref1+). The bank of capacitors serving as a capacitive DAC in the second, complementary part of the differential comparator 1200 serving as a capacitive DAC is responsive to a code 1210' (DVref1−) comprising a plurality of bits DVref1$_0$' . . . DVref1$_{N-1}$' representative of a second, complementary one of the differential/complementary reference voltages (DVref1−=Vref1−). The circuitry and timing of the circuitry is same/similar to FIGS. 4 and 5. Other equivalent implementations of the capacitive DACs in a differential manner are envisioned by the disclosure.

This is unique because an additional reference circuit is not needed to generate differential/complementary reference voltages Vref1+ and Vref1−. The differential/complementary reference voltages Vref1+ and Vref1− are effectively generated "internally" by the capacitive DACs in the differential comparator 1200. Specifically, the differential/complementary reference voltages Vref1+ and Vref1− are generated through connecting the bottom plates of the capacitors 404$_0$-404$_{N-1}$ and the capacitors 404$_0$'-404$_{N-1}$' to either +2 Vref or −2 Vref based on the code 1210 and code 1210' respectively and through charge redistribution occurring in the bank of capacitors. In the similar fashion as FIGS. 4 and 5, level shifting and charge redistribution in the circuit implement subtraction of the analog input (Vin+ and Vin−) by a reference voltage (Vref− and Vref+). This makes the differential comparator 1200 a reference-less comparator. Moreover, differential/complementary reference voltages Vref1+ and Vref1− are configurable or (digitally) programmable. The codes 1210 and 1210' can be gated by gate 1206 and 1206' respectively (or suitable switching circuitry), which makes the codes 1210 and 1210' available to make the selections (i.e., connections of the bottom plates in the bank of capacitors to +2 Vref or −2 Vref) in response to control signal ϕxfer.

In the differential comparator 1200, the output signals Vout− and Vout+ are connected to input terminals of comparator 1202, such as the one shown in FIG. 6B to build a differential comparator that compares the differential analog input signal (e.g., Vin+ and Vin−) against suitable differential reference voltages (e.g., Vref1+ and Vref1−). The comparator 1202 can be latched by clock signal ϕxfer_d, which is delayed by an amount of time from the phase of ϕxfer, to output a comparator decision D at the output of the differential comparator 1200. Clocking the comparator 1202 is optional. The comparator decision D can be a differential/complementary decision (e.g., D+ and D−). The differential comparator 1200 can be duplicated to compare the differential analog input signal against other differential/complementary reference voltages to build a bank of differential comparators, i.e., a reference-less flash ADC, to quantize the differential analog input signal and output a plurality of decisions representative of the differential analog input signal. Advantageously, such a flash ADC does not require a reference circuit to generate the differential/complementary reference voltages, and the differential/complementary reference voltages can be digitally programmable.

Methods for Comparing Signals

Figure 13:
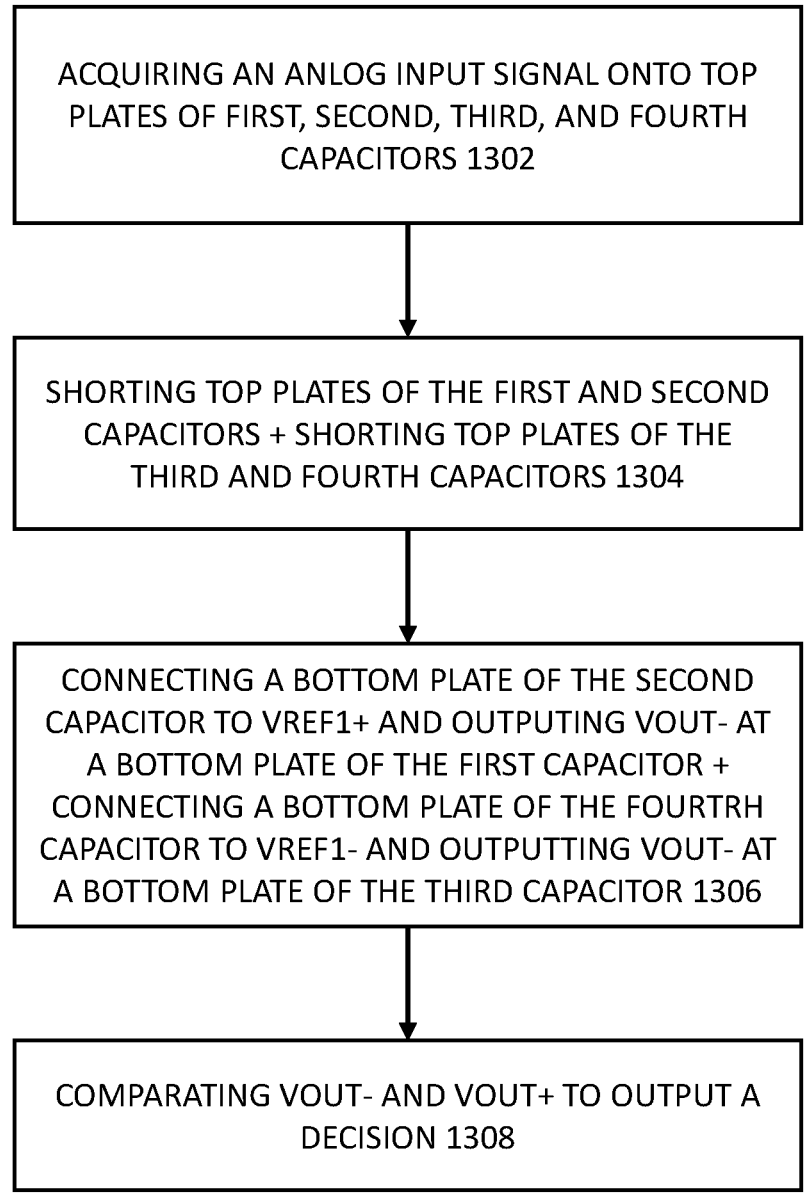
FIG. 13 is a flow diagram illustrating a method for comparing signals, according to some embodiments of the disclosure.

FIG. 13 is a flow diagram illustrating a method for comparing signals, according to some embodiments of the disclosure. Circuits for carrying out the method are illustrated with FIG. 11. In 1302, an analog input signal (e.g., Vin+ and Vin− of FIG. 11) is acquired onto top plates of a first capacitor (e.g., Cs 201) and a second capacitor (e.g., Cs 202) and top plates of a third capacitor (e.g., Cs 201') and a fourth capacitor (e.g., Cs 202'). In 1302, the top plates of the first and the second capacitors are shorted. Also, in 1302, top plates of the third and the fourth capacitors are shorted. In 1306, a bottom plate of the second capacitor is connected to a first one of complementary reference voltages (e.g., Vref1+) and outputting a first complementary output (e.g., Vout−) at a bottom plate of the first capacitor. Also, in 1306, a bottom plate of the fourth capacitor is connected to a second one of complementary reference voltages (e.g., Vref1−) and outputting a second complementary output (e.g., Vout+) at a bottom plate of the third capacitor. In 1308, the first complementary output and the second complementary output are compared to output a decision (e.g., by comparator 1102 to generate decision D) representative of a difference between the analog input signal and the complementary reference voltages.

Figure 14:
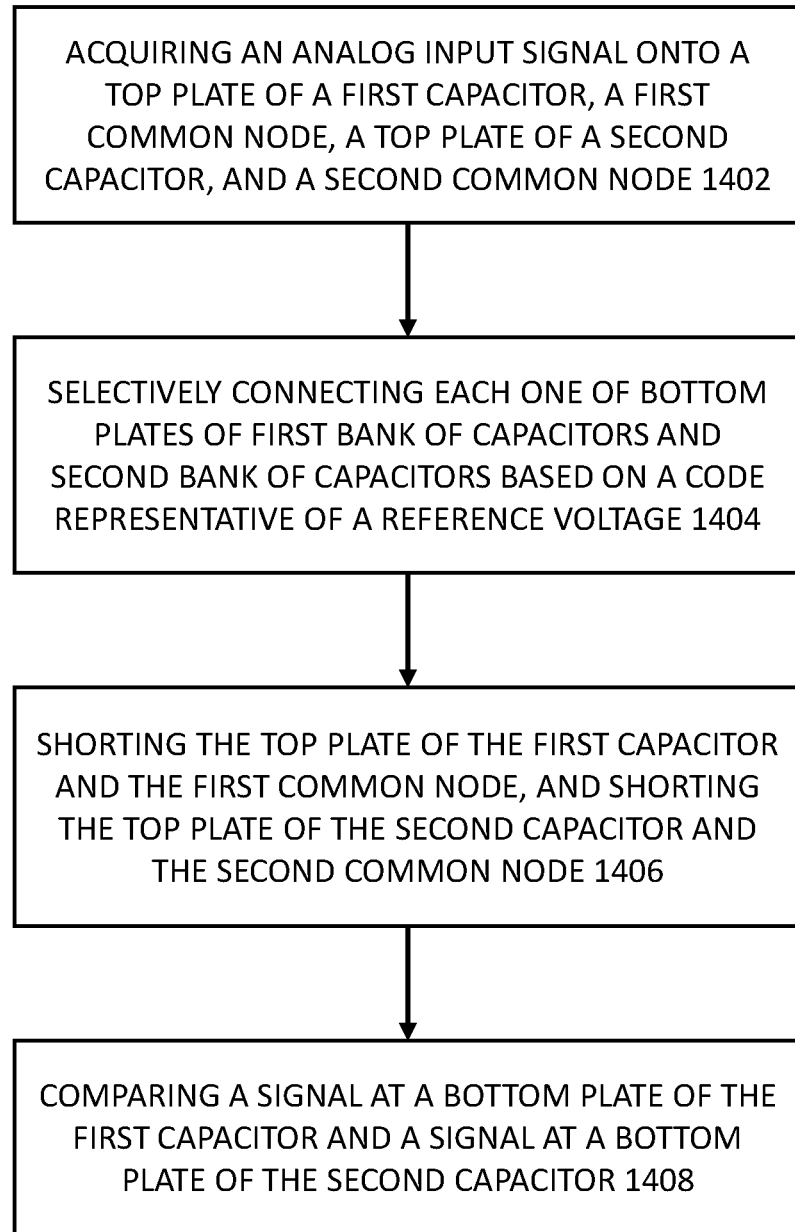
FIG. 14 is a flow diagram illustrating another method for comparing signals, according to some embodiments of the disclosure.

FIG. 14 is a flow diagram illustrating another method for comparing signals, according to some embodiments of the disclosure. Circuits for carrying out the method are illustrated with FIG. 12. In this method, the signal is compared against an internally generated reference voltage. In 1402, an analog input signal (e.g., Vin+ and Vin− of FIG. 12) is acquired onto a top plate of a first capacitor (e.g., Cs 401), a first common node (e.g., node 412) connecting top plates of a first bank of capacitors within a first capacitive digital-to-analog converter, a top plate of a second capacitor (e.g., Cs 401'), and a second common node (e.g., node 412') connecting top plates of a second bank of capacitors within a second capacitive digital-to-analog converter. In 1404, each one of bottom plates of the first bank of capacitors and the second bank of capacitors are selectively connected to a first voltage reference (e.g., +2 Vref) or a second voltage reference (e.g., −2 Vref) based on a code representative of a reference voltage (e.g., DVref1+, DVref1−). In 1406, the top plate of the first capacitor and the first common node of the first capacitive digital-to-analog converter are shorted. Also, in 1406, the top plate of the second capacitor and the second common node of the second capacitive digital-to-analog converter are shorted. In 1408, a signal at a bottom plate of the first capacitor (e.g., Vout−) and a signal at a bottom plate of the second capacitor (e.g., Vout+) are compared (e.g., by comparator 1202 to generate decision D).

EXAMPLES

Example 1 is a switched capacitor multiplying digital-to-analog converter (MDAC) with open loop gain, comprising: a bank of capacitors, each capacitor having a first plate and a second plate, wherein: each one of the first plates of the bank of capacitors is connectable to a common mode voltage, a first voltage reference, and a second voltage reference, and the second plates of the bank of capacitors are connected to a common node connectable to receive a first one of complementary analog input signals; a gain capacitor having a first plate connectable to receive a second one of the complementary analog input signals and a second plate at a first complementary output of the switched capacitor MDAC; and a transfer switch to connect the common node to the first plate of the gain capacitor.

In Example 2, the switched capacitor MDAC of Example 1 can optionally include sample switches to connect first plates of the bank of capacitors to the common mode voltage.

In Example 3, the switched capacitor MDAC of Example 1 or 2 can optionally include: multiplexers to connect the first voltage reference or the second voltage reference to respective first plates based on an output code.

In Example 4, the switched capacitor MDAC of Example 3 can optionally include the output code being received from an analog-to-digital converter.

In Example 5, the switched capacitor MDAC of any one of Examples 1-4 can optionally include a first input switch to connect the common node to the first one of the complementary analog input signals.

In Example 6, the switched capacitor MDAC of any one of Examples 1-5 can optionally include a second input switch to connect the first plate of the gain capacitor to the second one of the complementary analog input signals.

In Example 7, the switched capacitor MDAC of any one of Examples 1-6 can optionally include a sample switch to connect the second plate of the gain capacitor to ground.

In Example 8, the switched capacitor MDAC of any one of Examples 1-7 can optionally include a buffer at the first complementary output of the switched capacitor MDAC.

In Example 9, the switched capacitor MDAC of any one of Examples 1-7 can optionally include an open loop amplifier at the first complementary output of the switched capacitor MDAC.

In Example 10, the switched capacitor MDAC of any one of Examples 1-7 can optionally include a closed loop amplifier at the first complementary output of the switched capacitor MDAC.

In Example 11, the switched capacitor MDAC of any one of Examples 1-9 can optionally include a further bank of capacitors, a further gain capacitor, and a further transfer switch complementing the bank of capacitors, the gain capacitor, and the transfer switch respectively.

Example 12 is a method for residue generation, the method comprising: during a sample phase, connecting a first one of complementary analog input signals to a first plate of a gain capacitor, and connecting a second one of complementary analog input signals to a common node connecting first plates of capacitors within a capacitive digital-to-analog converter; and during a charge transfer phase, connecting the first plate of the gain capacitor to the common node, connecting each one of second plates of the capacitors within the capacitive digital-to-analog converter to a first reference or a second reference based on an output code controlling the capacitive digital-to-analog converter, and outputting a residue signal at a second plate of the gain capacitor.

In Example 13, the method of Example 12 can optionally include: during the sample phase, connecting a second plate of the gain capacitor to ground.

In Example 14, the method of Example 12 or 13 can optionally include: during the sample phase, disconnecting a second plate of the gain capacitor from ground before disconnecting the first plate of the gain capacitor from the first one of the complementary analog input signals.

In Example 15, the method of any one of Examples 12-14 can optionally include during the sample phase, connecting the second plates of the capacitors within the capacitive digital-to-analog converter to a common mode voltage.

In Example 16, the method of any one of Examples 12-15 can optionally include during the sample phase, disconnecting the second plates of the capacitors within the capacitive digital-to-analog converter from a common mode voltage before disconnecting the common node from the second one of the complementary analog input signals.

In Example 17, the method of any one of Examples 12-16 can optionally include prior to the charge transfer phase, converting an analog input signal into the output code by an analog-to-digital converter.

Example 18 is a method for generating a residue in a pipelined analog-to-digital converter, comprising: converting an analog input signal to an output code; acquiring the analog input signal onto a top plate of a capacitor and a common node connecting top plates of capacitors within a capacitive digital-to-analog converter; connecting each one of bottom plates of the capacitors within the capacitive digital-to-analog converter to a first voltage reference or a second voltage reference based on the output code; and connecting the top plate of the capacitor and the common node of the capacitive digital-to-analog converter.

In Example 19, the method of Example 18, can optionally include connecting each one of bottom plates of the capacitors within the capacitive digital-to-analog converter to the first voltage reference or the second voltage reference based on the output code implementing charge redistribution.

In Example 20, the method of Example 18 or 19 can optionally include connecting the top plate of the capacitor and the common node of the capacitive digital-to-analog converter stacking the capacitor and the capacitive digital-to-analog converter and implementing gain and subtraction.

Example 21 is a differential comparator, comprising: a first charge pump gain circuit comprising a first capacitor having a top plate to receive a first complementary analog input signal and a bottom plate to output a first complementary output, a second capacitor having a top plate to receive a second complementary analog input signal and a bottom plate to receive a first complementary reference voltage, and a first transfer switch for summing charges on the first and second capacitors; a second charge pump gain circuit complementary to the first charge pump gain circuit to output a second complementary output; and a comparator to receive first and second complementary output nodes and output a comparator decision.

In Example 22, the differential comparator of Example 21 can optionally include the second charge pump gain circuit comprising: a third capacitor having a top plate to receive the second complementary analog input signal and a bottom plate to output a second complementary output; a fourth capacitor having a top plate to receive the first complementary analog input signal and a bottom plate to receive a second complementary reference voltage; and a second transfer switch for summing charges on the third and fourth capacitors.

In Example 23, the differential comparator of Example 21 or 22 can optionally include the comparator being latched by a clock signal that is delayed from a clock signal that clocks the first transfer switch.

Example 24 is a method for comparing signals, the method comprising: acquiring an analog input signal onto top plates of a first capacitor and a second capacitor and top plates of a third capacitor and a fourth capacitor; shorting the top plates of the first and the second capacitors and shorting top plates of the third and the fourth capacitors; connecting a bottom plate of the second capacitor to a first one of complementary reference voltages and outputting a first complementary output at a bottom plate of the first capacitor, and connecting a bottom plate of the fourth capacitor to a second one of complementary reference voltages and outputting a second complementary output at a bottom plate of the third capacitor; and comparing the first complementary output and the second complementary output to output a decision representative of a difference between the analog input signal and the complementary reference voltages.

Example 25 is a differential comparator having an internally generated reference voltage, comprising: a first circuit to generate a first complementary output, the first circuit comprising a first capacitor having a top plate to receive a first complementary analog input signal and a bottom plate to output a first complementary output, a first bank of capacitors, wherein bottom plates of the first bank of capacitors are selectively connectable to a common mode voltage, a first voltage reference, and a second voltage reference based on a first code representative of a first complementary reference voltage, and top plates of the first bank of capacitors are connected to a first common node connectable to receive a second complementary analog input signal; a second circuit complementary to the first circuit to output a second complementary output; and a comparator to receive first and second complementary output nodes and output a comparator decision.

In Example 26, the differential comparator of Example 25 can optionally include the second circuit comprising: a second capacitor having a top plate to receive the second complementary analog input signal and a bottom plate to output the second complementary output; a second bank of capacitors, wherein bottom plates of the second bank of capacitors are selectively connectable to the common mode voltage, the first voltage reference, and the second voltage reference based on a second code representative of a second complementary reference voltage, and top plates of the second bank of capacitors are connected to a second common node connectable to receive the first complementary analog input signal.

Example 27 is a method for comparing a signal against an internally generated reference voltage, the method comprising: acquiring an analog input signal onto a top plate of a first capacitor, a first common node connecting top plates of a first bank of capacitors within a first capacitive digital-to-analog converter, a top plate of a second capacitor, and a second common node connecting top plates of a second bank of capacitors within a second capacitive digital-to-analog converter; selectively connecting each one of bottom plates of the first bank of capacitors and the second bank of capacitors to a first voltage reference or a second voltage reference based on a code representative of a reference voltage; shorting the top plate of the first capacitor and the first common node of the first capacitive digital-to-analog converter, and shorting the top plate of the second capacitor and the second common node of the second capacitive digital-to-analog converter; and comparing a signal at a bottom plate of the first capacitor and a signal at a bottom plate of the second capacitor.

Example A is an apparatus comprising means for implementing and/or carrying out any one of the methods in Examples 12-20, 24, and 27, and any of the methods described herein.

Variations and Implementations

While the examples in FIGS. 4, 5, 11, and 12 show a 2× CP gain circuit on the input Vin, it is envisioned that other gain multipliers can be implemented. For instance, it is possible to modify the circuits seen in FIGS. 4, 5, 11, and 12 to implement higher gain, e.g., 4× gain, according to some embodiments of the disclosure. Referring back to FIG. 4, to provide additional (passive) gain, additional gain capacitors, additional corresponding input switches, and additional corresponding transfer switches can be added in series with the bottom plate side of gain capacitor Cs 401. Stacking more gain capacitors in a CP gain fashion can implement higher gain on the input Vin. The voltage references for the capacitive DAC may be adjusted according to the gain on the input Vin.

While some embodiments show a differential/complementary implementation, it can also be beneficial in some cases to implement the circuits in single-ended form. The differential/complementary implementations of the switched capacitor MDAC and the switched capacitor comparator have single-ended equivalents.

In certain contexts, the features discussed herein can be applicable to converters being used in many different applications. Various exemplary applications include medical systems, scientific instrumentation, transportation systems, aerospace systems, wireless and wired communications, radar, industrial process control, audio and video equipment, consumer devices, and other converter-based systems.

In the discussions of the embodiments above, the capacitors, clocks, resistors, switches, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, the circuits described herein may be provided on a board of an associated electronic device. The board can be a general circuit board that can hold various components of the internal electronic system of the electronic device and, further, provide connectors for other peripherals. For instance, the circuits described herein can communicate with the components of the associated electronic device (e.g., signal generators, processors, memory, transmitters, receivers, etc.). More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the examples and appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the examples and appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the described functions illustrate only some of the possible functions that may be executed by, or within, circuits and systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

What is claimed is:

1. A differential comparator, comprising:
    a first charge pump gain circuit comprising:
        a first capacitor having a top plate to receive a first complementary analog input signal and a bottom plate to output a first complementary output,
        a second capacitor having a top plate to receive a second complementary analog input signal and a bottom plate to receive a first complementary reference voltage, and
        a first transfer switch for summing charges on the first and second capacitors;
    a second charge pump gain circuit complementary to the first charge pump gain circuit to output a second complementary output; and
    a comparator to receive first and second complementary outputs and output a comparator decision.

2. The differential comparator of claim 1, wherein the second charge pump gain circuit comprises:

a third capacitor having a top plate to receive the second complementary analog input signal and a bottom plate to output a second complementary output;

a fourth capacitor having a top plate to receive the first complementary analog input signal and a bottom plate to receive a second complementary reference voltage; and a second transfer switch for summing charges on the third and fourth capacitors.

3. The differential comparator of claim 1, wherein the comparator is latched by a clock signal that is delayed from a clock signal that clocks the first transfer switch.

4. The differential comparator of claim 1, wherein the first charge pump gain circuit further comprises:
   a first input switch to connect the top plate of the first capacitor to the first complementary analog input signal; and
   a second input switch to connect the top plate of the second capacitor to the second complementary analog input signal.

5. The differential comparator of claim 1, wherein the first charge pump gain circuit further comprises:
   a first bottom plate switch to connect the bottom plate of the first capacitor to ground; and
   a second bottom plate switch to connect the bottom plate of the second capacitor to ground.

6. The differential comparator of claim 1, wherein the first charge pump gain circuit further comprises:
   a third transfer switch to connect the bottom plate of the second capacitor to the first complementary reference voltage.

7. A differential comparator having an internally generated reference voltage, comprising:
   a first circuit to generate a first complementary output, the first circuit comprising:
      a first capacitor having a top plate to receive a first complementary analog input signal and a bottom plate to output a first complementary output, and
      a first bank of capacitors, wherein:
         bottom plates of the first bank of capacitors are selectively connectable to a common mode voltage, a first voltage reference, and a second voltage reference based on a first code representative of a first complementary reference voltage, and
         top plates of the first bank of capacitors are connected to a first common node connectable to receive a second complementary analog input signal;
   a second circuit complementary to the first circuit to output a second complementary output; and
   a comparator to receive first and second complementary outputs and output a comparator decision.

8. The differential comparator of claim 7, wherein the first circuit comprises a first transfer switch to connect the top plate of the first capacitor and the first common node.

9. The differential comparator of claim 8, wherein the comparator is latched by a clock signal that is delayed from a clock signal that clocks the first transfer switch.

10. The differential comparator of claim 7, wherein the first circuit comprises a first gate to gate the first code in response to a first control signal.

11. The differential comparator of claim 7, wherein the first bank of capacitors is a first capacitive digital-to-analog converter responsive to the first code.

12. The differential comparator of claim 7, wherein the first code comprises a plurality of bits representative of the first complementary reference voltage.

13. The differential comparator of claim 7, wherein the second circuit comprises:
   a second capacitor having a top plate to receive the second complementary analog input signal and a bottom plate to output the second complementary output; and
   a second bank of capacitors, wherein:
      bottom plates of the second bank of capacitors are selectively connectable to the common mode voltage, the first voltage reference, and the second voltage reference based on a second code representative of a second complementary reference voltage, and
      top plates of the second bank of capacitors are connected to a second common node connectable to receive the first complementary analog input signal.

14. The differential comparator of claim 13, wherein the second circuit comprises a second transfer switch to connect the top plate of the second capacitor and the second common node.

15. The differential comparator of claim 13, wherein the second circuit comprises a second gate to gate the second code in response to a second control signal.

16. The differential comparator of claim 13, wherein the second bank of capacitors is a second capacitive digital-to-analog converter responsive to the second code.

17. The differential comparator of claim 13, wherein the second code comprises a plurality of bits representative of the second complementary reference voltage.

18. A reference-less flash analog-to-digital converter, comprising:
   a first differential comparator according to claim 13; and
   a second differential comparator according to claim 13,
   wherein the first differential comparator and the second differential comparator quantize a differential analog input signal and output first and second decisions representative of the differential analog input signal.

19. A method for comparing an analog input signal against an internally generated reference voltage, the method comprising:
   acquiring an analog input signal onto a top plate of a first capacitor, a first common node connecting top plates of a first bank of capacitors within a first capacitive digital-to-analog converter, a top plate of a second capacitor, and a second common node connecting top plates of a second bank of capacitors within a second capacitive digital-to-analog converter;
   selectively connecting each one of bottom plates of the first bank of capacitors and the second bank of capacitors to a first voltage reference or a second voltage reference based on a code representative of a reference voltage;
   shorting the top plate of the first capacitor and the first common node of the first capacitive digital-to-analog converter, and shorting the top plate of the second capacitor and the second common node of the second capacitive digital-to-analog converter; and
   comparing a signal at a bottom plate of the first capacitor and a signal at a bottom plate of the second capacitor.

20. The method of claim 19, wherein the comparing step is delayed by an amount of time from the selectively connecting step.

* * * * *